US012765103B2

(12) United States Patent
Onuki et al.

(10) Patent No.: US 12,765,103 B2
(45) Date of Patent: Oct. 13, 2026

(54) IMAGING DEVICE AND ELECTRONIC DEVICE

(71) Applicant: SEMICONDUCTOR ENERGY LABORATORY CO., LTD., Atsugi (JP)

(72) Inventors: Tatsuya Onuki, Atsugi (JP); Kiyoshi Kato, Atsugi (JP); Takanori Matsuzaki, Atsugi (JP); Hajime Kimura, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 38 days.

(21) Appl. No.: 19/008,853

(22) Filed: Jan. 3, 2025

(65) Prior Publication Data

US 2025/0151443 A1 May 8, 2025

Related U.S. Application Data

(63) Continuation of application No. 18/105,005, filed on Feb. 2, 2023, now Pat. No. 12,199,122, which is a (Continued)

(30) Foreign Application Priority Data

Nov. 23, 2017 (JP) ................................. 2017-225285
Feb. 23, 2018 (JP) ................................. 2018-030881

(51) Int. Cl.
*H10F 39/00* (2025.01)
*H04N 25/771* (2023.01)

(Continued)

(52) U.S. Cl.
CPC ......... *H10F 39/809* (2025.01); *H04N 25/771* (2023.01); *H04N 25/772* (2023.01);

(Continued)

(58) Field of Classification Search
CPC .... H04N 25/771; H04N 25/772; H04N 25/76; H04N 25/77; H04N 25/78; H04N 25/79;

(Continued)

(56) References Cited

U.S. PATENT DOCUMENTS 7,947,528 B2 5/2011 Iwabuchi et al.
8,049,293 B2 11/2011 Iwabuchi et al.

(Continued)

FOREIGN PATENT DOCUMENTS

CN 101228631 A 7/2008
CN 101753866 A 6/2010

(Continued)

OTHER PUBLICATIONS

International Search Report (Application No. PCT/IB2018/058883) Dated Feb. 5, 2019.

(Continued)

*Primary Examiner* — Marly S Camargo
(74) *Attorney, Agent, or Firm* — Fish & Richardson P.C.

(57) ABSTRACT

An imaging device which has a stacked-layer structure and can be manufactured easily is provided. The imaging device includes a signal processing circuit, a memory device, and an image sensor. The imaging device has a stacked-layer structure in which the memory device is provided above the signal processing circuit, and the image sensor is provided above the memory device. The signal processing circuit includes a transistor formed on a first semiconductor substrate, the memory device includes a transistor including a metal oxide in a channel formation region, and the image sensor includes a transistor formed on a second semiconductor substrate.

1 Claim, 16 Drawing Sheets

Related U.S. Application Data continuation of application No. 16/763,024, filed as application No. PCT/IB2018/058883 on Nov. 13, 2018, now Pat. No. 11,574,945.

(51) Int. Cl.

| | |
|---|---|
| ***H04N 25/772*** | (2023.01) |
| ***H04N 25/79*** | (2023.01) |
| ***H10B 12/00*** | (2023.01) |
| ***H10D 30/67*** | (2025.01) |
| ***H10D 86/40*** | (2025.01) |
| ***H10D 86/60*** | (2025.01) |
| ***H10D 87/00*** | (2026.01) |

(52) U.S. Cl.

CPC ......... *H10B 12/00* (2023.02); *H10D 30/6734* (2025.01); *H10D 30/6755* (2025.01); *H10D 86/423* (2025.01); *H10D 86/481* (2025.01); *H10D 86/60* (2025.01); *H10D 87/00* (2025.01)

(58) Field of Classification Search

CPC .. H10F 39/809; H10F 39/811; H10F 39/8037; H10D 87/00; H10D 30/6734; H10D 86/60; H10D 30/6755; H10D 86/481; H10D 86/423; H10B 12/00

See application file for complete search history.

(56) References Cited

U.S. PATENT DOCUMENTS

| | | | | |
|---|---|---|---|---|
| 8,309,392 | B2 | 11/2012 | Iwabuchi et al. | |
| 8,440,499 | B2 | 5/2013 | Iwabuchi et al. | |
| 8,841,743 | B2 | 9/2014 | Iwabuchi et al. | |
| 8,946,610 | B2 | 2/2015 | Iwabuchi et al. | |
| 9,093,136 | B2 * | 7/2015 | Kurokawa | H10D 86/423 365/174 |
| 9,117,710 | B2 | 8/2015 | Iwabuchi et al. | |
| 9,673,249 | B2 | 6/2017 | Iwabuchi et al. | |
| 9,865,549 | B2 | 1/2018 | Shigetoshi | |
| 9,923,001 | B2 | 3/2018 | Yamazaki | |
| 9,955,097 | B2 | 4/2018 | Iwabuchi et al. | |
| 10,021,329 | B2 | 7/2018 | Ohmaru | |
| 10,090,296 | B2 | 10/2018 | Shigetoshi | |
| 10,129,497 | B2 | 11/2018 | Iwabuchi et al. | |
| 10,375,282 | B2 | 8/2019 | Ishida et al. | |
| 10,594,972 | B2 | 3/2020 | Iwabuchi et al. | |
| 10,645,324 | B2 | 5/2020 | Iwabuchi et al. | |
| 11,056,463 | B2 | 7/2021 | Takahashi et al. | |
| 11,574,945 | B2 | 2/2023 | Onuki et al. | |
| 12,191,313 | B2 * | 1/2025 | Yamazaki | H10D 86/423 |
| 12,199,122 | B2 * | 1/2025 | Onuki | H04N 25/771 |
| 12,212,873 | B2 * | 1/2025 | Negoro | H10D 30/67 |
| 2010/0276572 | A1 | 11/2010 | Iwabuchi et al. | |
| 2012/0057396 | A1 | 3/2012 | Yamazaki et al. | |
| 2014/0175592 | A1 | 6/2014 | Iwabuchi et al. | |
| 2015/0097258 | A1 | 4/2015 | Shigetoshi | |
| 2016/0037106 | A1 | 2/2016 | Ohmaru | |
| 2016/0255296 | A1 | 9/2016 | Iwabuchi et al. | |
| 2016/0284753 | A1 | 9/2016 | Komai et al. | |
| 2016/0351598 | A1 | 12/2016 | Yamazaki | |
| 2016/0358967 | A1 | 12/2016 | Madurawe et al. | |
| 2017/0187977 | A1 | 6/2017 | Iwabuchi et al. | |
| 2017/0195602 | A1 | 7/2017 | Iwabuchi et al. | |
| 2017/0263665 | A1 | 9/2017 | Komai et al. | |
| 2018/0054583 | A1 | 2/2018 | Iwabuchi et al. | |
| 2018/0130743 | A1 | 5/2018 | Shigetoshi | |
| 2019/0053406 | A1 | 2/2019 | Tezuka | |
| 2019/0182419 | A1 | 6/2019 | Sekiguchi et al. | |
| 2022/0157873 | A1 | 5/2022 | Komai et al. | |
| 2023/0268349 | A1 | 8/2023 | Yamazaki | |
| 2026/0013250 | A1 * | 1/2026 | Shiozawa | H10F 39/8053 |

FOREIGN PATENT DOCUMENTS

| | | | |
|---|---|---|---|
| CN | 101753867 | A | 6/2010 |
| CN | 104576668 | A | 4/2015 |
| EP | 3383019 | A | 10/2018 |
| EP | 3439282 | A | 2/2019 |
| EP | 3540776 | A | 9/2019 |
| JP | 2012-256820 | A | 12/2012 |
| JP | 2013-179313 | A | 9/2013 |
| JP | 2015-076502 | A | 4/2015 |
| JP | 2015-135938 | A | 7/2015 |
| JP | 2016-054478 | A | 4/2016 |
| JP | 2016-213298 | A | 12/2016 |
| JP | 2017-130654 | A | 7/2017 |
| KR | 2016-0016638 | A | 2/2016 |
| KR | 2018-0019652 | A | 2/2018 |
| TW | 201101476 | | 1/2011 |
| TW | 201607321 | | 2/2016 |
| WO | WO-2006/129762 | | 12/2006 |
| WO | WO-2015/093017 | | 6/2015 |
| WO | WO-2016/098691 | | 6/2016 |
| WO | WO-2017/090437 | | 6/2017 |
| WO | WO-2017/149845 | | 9/2017 |
| WO | WO-2017/170716 | | 10/2017 |

OTHER PUBLICATIONS

Written Opinion (Application No. PCT/IB2018/058883) Dated Feb. 5, 2019.

Onuki.T et al., "DRAM with Storage Capacitance of 3.9 fF using CAAC-OS Transistor with L of 60 nm andhaving More Than 1-h Retention Characteristics", SSDM 2014 (Extended Abstracts of the 2014 International Conference on Solid State Devices and Materials), Sep. 8, 2014, pp. 430-431.

Haruta.T et al., "A 1/2.3inch 20Mpixel 3-Layer Stacked CMOS Image Sensor with DRAM", ISSCC 2017 (Digest of Technical Papers. IEEE International Solid-State Circuits Conference), Feb. 5, 2017, pp. 76-78.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10, The Japan Society of Applied Physics.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7, The Japan Society of Applied Physics.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

Retention characteristics at 85°C

IMAGING DEVICE AND ELECTRONIC DEVICE

CROSS REFERENCE TO RELATED APPLICATIONS

This application is a continuation of U.S. application Ser. No. 18/105,005, filed Feb. 2, 2023, now allowed, which is incorporated by reference and is a continuation of U.S. application Ser. No. 16/763,024, filed May 11, 2020, now U.S. Pat. No. 11,574,945, which is incorporated by reference and is a U.S. National Phase Application under 35 U.S.C. § 371 of International Application PCT/IB2018/058883, filed on Nov. 13, 2018, which is incorporated by reference and claims the benefit of foreign priority applications filed in Japan on Nov. 23, 2017, as Application No. 2017-225285, and on Feb. 23, 2018, as Application No. 2018-030881.

TECHNICAL FIELD

One embodiment of the present invention relates to an imaging device. In particular, one embodiment of the present invention relates to an imaging device with a stacked-layer structure.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

A MOS image sensor typified by CMOS (Complementary Metal Oxide Semiconductor) is known as an imaging device that is widely used for electronic devices, such as a digital video camera, a digital camera, and a smartphone.

In recent years, a stacked-layer structure in which a plurality of semiconductor chips having different functions are stacked to be electrically connected has been in practical use for an imaging device. By employing the stacked-layer structure, manufacturing methods and materials used for the semiconductor chips can be selected to match the respective functions of the semiconductor chips; accordingly, a more sophisticated imaging device can be easily achieved and the size and weight of an electronic device including the imaging device can be reduced.

Non-Patent Document 1 discloses an example of an imaging device in which a signal processing circuit, a memory device, and a MOS image sensor are stacked. Non-Patent Document 1 describes that, with the structure in which a DRAM (Dynamic Random Access Memory) is used as a memory device and data of a captured image is stored in the DRAM, high-speed imaging exceeding a speed for transferring data to and from an electronic device including the imaging device can be achieved.

Meanwhile, a silicon-based semiconductor material is widely known as a semiconductor that can be used in a transistor, and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as an IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 2 to Non-Patent Document 4). In Non-Patent Document 2 and Non-Patent Document 3, a technique for manufacturing a transistor using an oxide semiconductor having a CAAC structure is also disclosed. Moreover, Non-Patent Document 5 and Non-Patent Document 6 show that a fine crystal is included even in an oxide semiconductor which has lower crystallinity than an oxide semiconductor having the CAAC structure or the nc structure.

In addition, a transistor using an oxide semiconductor has an extremely low off-state current (see Non-Patent Document 7), and an LSI and a display utilizing the characteristics have been reported (see Non-Patent Document 8 and Non-Patent Document 9).

A DRAM in which a transistor using an oxide semiconductor is used for a DRAM cell is suggested (e.g., Patent Document 1 and Non-Patent Document 10). The transistor using an oxide semiconductor has an extremely low leakage current in an off state (off-state current), and thus enables fabrication of a low-power-consumption memory having long refresh intervals. In this specification and the like, a DRAM in which the transistor using an oxide semiconductor is used for a DRAM cell is referred to as an "oxide semiconductor DRAM" or a "DOSRAM (registered trademark, Dynamic Oxide Semiconductor Random Access Memory)".

REFERENCE

Patent Document

[Patent Document 1] Japanese Published Patent Application No. 2012-256820

Non-Patent Document

[Non-patent Document 1] Tsutomu Haruta et al., "A 1/2.3 inch 20M pixel 3-Layer Stacked CMOS Image Sensor with DRAM", IEEE ISSCC Dig. Tech. Papers, 2017, pp. 76-78.

[Non-Patent Document 2] S. Yamazaki et al., "SID Symposium Digest of Technical Papers", 2012, volume 43, issue 1, pp. 183-186.

[Non-Patent Document 3] S. Yamazaki et al., "Japanese Journal of Applied Physics", 2014, volume 53, Number 4S, pp. 04ED18-1-04ED18-10.

[Non-Patent Document 4] S. Ito et al., "The Proceedings of AM-FPD'13 Digest of Technical Papers", 2013, pp. 151-154.

[Non-Patent Document 5] S. Yamazaki et al., "ECS Journal of Solid State Science and Technology", 2014, volume 3, issue 9, pp. Q3012-Q3022.

[Non-Patent Document 6] S. Yamazaki, "ECS Transactions", 2014, volume 64, issue 10, pp. 155-164.

[Non-Patent Document 7] K. Kato et al., "Japanese Journal of Applied Physics", 2012, volume 51, pp. 021201-1-021201-7.

[Non-Patent Document 8] S. Matsuda et al., "2015 Symposium on VLSI Technology Digest of Technical Papers", 2015, pp. T216-T217.

[Non-Patent Document 9] S. Amano et al., "SID Symposium Digest of Technical Papers", 2010, volume 41, issue 1, pp. 626-629.

[Non-Patent Document 10] T. Onuki, et al., "DRAM with Storage Capacitance of 3.9 fF using CAAC-OS Transistor with L of 60 nm and having More Than 1-h Retention Characteristics," Ext. Abstr. SSDM, 2014, pp. 430-431.

SUMMARY OF THE INVENTION

Problems to be Solved by the Invention

In Non-Patent Document 1, a signal processing circuit, a memory device, and a MOS image sensor are formed over different semiconductor chips, and the three semiconductor chips are stacked to be electrically connected to one another. Here, when surfaces where the signal processing circuit, the memory device, and the MOS image sensor are formed are called top surfaces of the semiconductor chips, specifically, the top surface of the semiconductor chip in the second layer (the memory device) is attached to the top surface of the semiconductor chip in the first layer (the signal processing circuit) such that the top surfaces face each other, and then the semiconductor chip in the second layer is thinned. Moreover, the top surface of the semiconductor chip in the third layer (the MOS image sensor) is attached to the semiconductor chip in the second layer, and then the semiconductor chip in the third layer is thinned. In this manner, an imaging device including a "back illuminated" MOS image sensor is manufactured in which light that enters from a bottom surface (thinned surface) of the semiconductor chip in the third layer is detected.

However, the above manufacturing method is difficult because the method has two attaching steps and two thinning steps, and moreover, a silicon substrate of the semiconductor chip in the second layer needs to have a penetrating portion for electrical connection. Accordingly, it is not easy to increase the storage capacity by an increase in the number of stacked memory devices. There is also a problem in that attachment of the semiconductor chips has a problem of heat generation but the DRAM employed as the memory device is relatively not resistant to heat.

An object of one embodiment of the present invention is to provide an imaging device which has a stacked-layer structure and can be easily manufactured. Another object is to provide an imaging device which has a stacked-layer structure and whose storage capacity can be easily increased. Another object is to provide an imaging device which has a stacked-layer structure and includes a highly reliable memory device with high heat resistance.

Another object of one embodiment of the present invention is to provide a novel imaging device. Another object of one embodiment of the present invention is to provide an electronic device including a novel imaging device.

Note that one embodiment of the present invention does not necessarily achieve all the objects listed above and only needs to achieve at least one of the objects. The description of the above objects does not preclude the existence of other objects. Objects other than these will be apparent from the description of the specification, the claims, the drawings, and the like, and objects other than these can be derived from the description of the specification, the claims, the drawings, and the like.

Means for Solving the Problems

One embodiment of the present invention is an imaging device including a first layer, a second layer above the first layer, and a third layer above the second layer. The first layer includes a signal processing circuit, the second layer includes a memory device, and the third layer includes an image sensor. The signal processing circuit includes a transistor formed on a first semiconductor substrate, the memory device includes a transistor including a metal oxide in a channel formation region, and the image sensor includes a transistor formed on a second semiconductor substrate.

Another embodiment of the present invention is an imaging device including a first layer, a second layer above the first layer, and a third layer above the second layer. The first layer includes a signal processing circuit, the second layer includes a memory device, and the third layer includes an image sensor. The memory device includes a plurality of memory cells, the memory cell includes a transistor and a capacitor, one of a source and a drain of the transistor is electrically connected to one electrode of the capacitor, and the transistor includes a metal oxide in a channel formation region. The signal processing circuit includes a transistor formed on a first semiconductor substrate, and the image sensor includes a transistor formed on a second semiconductor substrate.

In the above embodiment, the signal processing circuit may have a function of controlling operation of the memory device and the image sensor.

In the above embodiment, at least one of the signal processing circuit and the image sensor may include an analog-digital conversion circuit, and the analog-digital conversion circuit may have a function of converting image data generated by the image sensor to a digital signal.

In the above embodiment, the memory device may have a function of retaining the digital signal.

Effect of the Invention

One embodiment of the present invention can provide an imaging device which has a stacked-layer structure and can be easily manufactured. An imaging device which has a stacked-layer structure and whose storage capacity can be easily increased can be provided. An imaging device which has a stacked-layer structure and includes a highly reliable memory device with high heat resistance can be provided.

An imaging device which has a stacked-layer structure and the cost of which is lowered can be provided. An imaging device which has a stacked-layer structure and whose power consumption is reduced by a reduction in the refresh rate can be provided.

One embodiment of the present invention can provide a novel imaging device. One embodiment of the present invention can provide an electronic device including a novel imaging device.

Note that the description of the effects does not disturb the existence of other effects. One embodiment of the present invention does not necessarily have all the effects. Effects other than these will be apparent from the description of the specification, the claims, the drawings, and the like, and effects other than these can be derived from the description of the specification, the claims, the drawings, and the like.

MODE FOR CARRYING OUT THE INVENTION

Figure 1A:
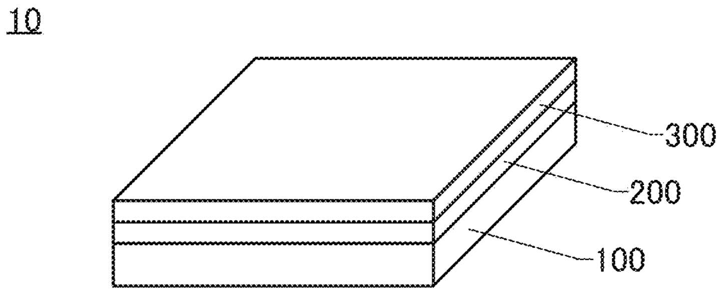
FIGS. 1A and 1B are perspective views illustrating a structure example of an imaging device.

Hereinafter, embodiments will be described with reference to drawings. However, the embodiments can be implemented with many different modes, and it will be readily appreciated by those skilled in the art that modes and details thereof can be changed in various ways without departing from the spirit and scope thereof. Thus, the present invention should not be construed as being limited to the description in the embodiments given below.

A plurality of embodiments described below can be combined as appropriate. In addition, in the case where a plurality of structure examples are described in one embodiment, the structure examples can be combined as appropriate.

In the drawings and the like, the size, the layer thickness, the region, or the like is exaggerated for clarity in some cases. Therefore, the size, the layer thickness, or the region is not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

In this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, "voltage" often refers to a potential difference between a given potential and a reference potential (e.g., a ground potential). Thus, a voltage and a potential difference can be interchanged with each other.

In this specification and the like, a transistor is an element having at least three terminals including a gate, a drain, and a source. A channel formation region is included between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Thus, the terms of source and drain are interchangeable for use in this specification and the like.

Unless otherwise specified, off-state current in this specification and the like refers to a drain current of a transistor in an off state (also referred to as a non-conducting state or a cutoff state). Unless otherwise specified, the off state of an n-channel transistor refers to a state where a voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to a source current when the transistor is in an off state. In addition, leakage current sometimes expresses the same meaning as off-state current. In this specification and the like, the off-state current sometimes refers to a current that flows between a source and a drain when a transistor is in the off state.

In this specification and the like, a metal oxide means an oxide of metal in a broad sense. Metal oxides are classified into an oxide insulator, an oxide conductor (including a transparent oxide conductor), an oxide semiconductor, and the like. For example, in the case where a metal oxide is used in a channel formation region of a transistor, the metal oxide is called an oxide semiconductor in some cases. That is, in the case where a metal oxide has at least one of an amplifying function, a rectifying function, and a switching function, the metal oxide can be called a metal oxide semiconductor. Hereinafter, a transistor including a metal oxide in a channel formation region is also referred to as an "oxide semiconductor transistor" or an "OS transistor". Furthermore, the "transistor including an oxide semiconductor" described above is also the transistor including a metal oxide in a channel formation region.

Furthermore, in this specification and the like, a metal oxide containing nitrogen is in some cases also collectively referred to as a metal oxide. A metal oxide containing nitrogen may be referred to as a metal oxynitride. The details of a metal oxide will be described later.

Embodiment 1

In this embodiment, structure examples of an imaging device of embodiments of the present invention will be described. An imaging device of one embodiment of the present invention has a structure in which a layer including a transistor formed over a semiconductor substrate and a layer including an OS transistor are stacked, and the transistor formed over the semiconductor substrate and a layer including a photodiode are stacked and bonded.

<Structure Example of Imaging Device>

FIG. 1(A) is a perspective view illustrating a structure example of an imaging device 10 of one embodiment of the present invention.

The imaging device 10 includes a layer 100, a layer 200, and a layer 300. The imaging device 10 has a stacked-layer structure in which the layer 200 is stacked over the layer 100, and the layer 300 is stacked over the layer 200 as illustrated in FIG. 1(A). Note that an interlayer insulating layer can be provided between the layer 100 and the layer 200.

Figure 1B:
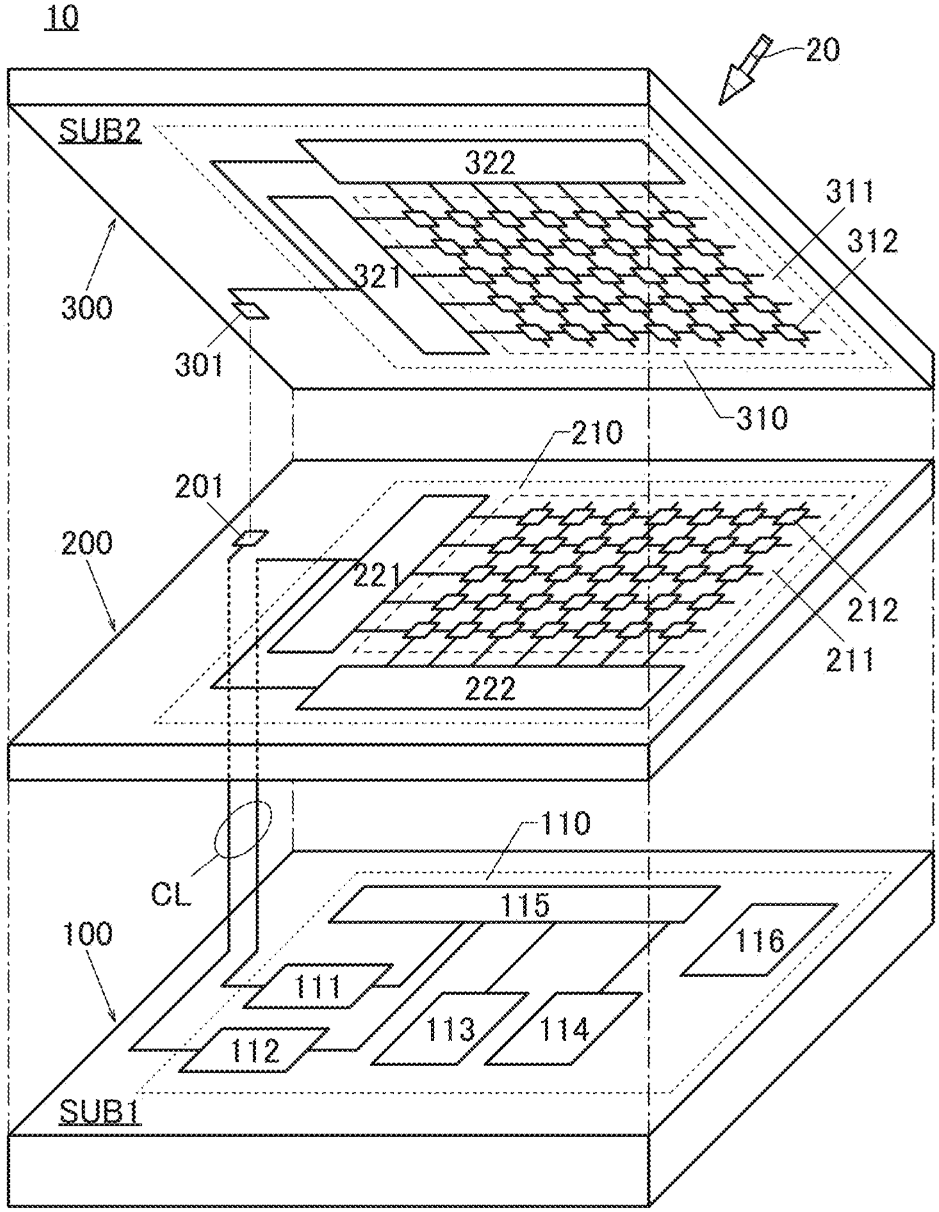

FIG. 1(B) is a perspective view for easy understanding of the structure example of the imaging device 10.

Each of the layer 100, the layer 200, and the layer 300 is provided with a device or a circuit which can function by utilizing semiconductor characteristics; the layer 100 is provided with a signal processing circuit 110, the layer 200 is provided with a memory device 210, and the layer 300 is provided with an image sensor 310.

<Signal Processing Circuit 110>

The signal processing circuit 110 has a function of controlling operation of the memory device 210 and the image sensor 310, a function of processing image data generated by the image sensor 310, and a function of transmitting and receiving data, a control signal, and the like to and from an electronic device including the imaging device 10, for example.

Specifically, for example, the signal processing circuit 110 includes a control circuit 111, a control circuit 112, an image processing circuit 113, and an input/output circuit 114 (see FIG. 1(B)).

The control circuit 111 has a function of supplying data to be written to the memory device 210, an address signal for specifying an address of the memory device 210 that performs data reading/writing, a control signal for controlling operation of the memory device 210, and the like. The control circuit 111 also has a function of receiving data read out from the memory device 210.

The control circuit 112 has a function of receiving image data generated by the image sensor 310 and a function of supplying a control signal or the like for controlling the operation of the image sensor 310. The control circuit 112 may include an analog-digital conversion circuit (Analog-Digital Converter: ADC).

The image processing circuit 113 has a function of performing, for example, gamma correction, dimming, toning, noise removal, distortion correction, video codic, and the like on image data generated by the image sensor 310. The image processing circuit 113 may also have a function of performing face detection, automatic scene recognition, and high dynamic range rendering (HDR).

Here, the automatic scene recognition means that a scene such as ambient environment is recognized and exposure, focus, flash, and the like are automatically adjusted. The image processing circuit 113 does not need to perform all of the above-described processing steps and can select processing steps as needed.

The input/output circuit 114 has a function of transmitting and receiving data, a control signal, and the like to/from the electronic device including the imaging device 10. For the input/output circuit 114, for example, an interface, such as LVDS (Low-Voltage Differential Signaling), MIPI (Mobile Industry Processor Interface), or SPI (Serial Peripheral Interface), is used.

In addition, the signal processing circuit 110 may include a bus line 115, a power supply circuit 116, and the like. FIG. 1(B) illustrates a state in which the control circuit 111, the control circuit 112, the image processing circuit 113, and the input/output circuit 114 are connected through the bus line 115.

The signal processing circuit 110 is formed with transistors formed over a semiconductor substrate SUB1. The semiconductor substrate SUB1 is not particularly limited as long as a channel region of a transistor can be formed thereon. For example, a single crystal silicon substrate, a single crystal germanium substrate, a compound semiconductor substrate (such as a SiC substrate or a GaN substrate), an SOI (Silicon on Insulator) substrate, or the like can be used.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by thermal treatment; an ELTRAN method (a registered trademark: Epitaxial Layer Transfer). A transistor formed using a single crystal substrate contains a single crystal semiconductor in a channel region.

In this embodiment, a case in which a single crystal silicon substrate is used as the semiconductor substrate SUB1 will be described as an example. Hereinafter, a transistor formed over a single crystal silicon substrate is referred to as a Si transistor.

<Memory Device 210>

The memory device 210 is connected to the control circuit 111 through a wiring CL that connects the layer 100 to the layer 200. The wiring CL is formed of a conductor formed in a contact hole in the layer 100 and the layer 200. Then, input/output of data and signals between the memory device 210 and the control circuit 111 are performed through the wiring CL.

The memory device 210 provided in the layer 200 includes a cell array 211, a driver circuit 221, and a driver circuit 222. The cell array 211 is composed of a plurality of memory cells 212 arranged in a matrix.

The memory cell 212 has a function of storing data. The memory cell 212 may have a function of storing binary (high level and low level) data or may have a function of storing multilevel data of four or more levels. The memory cell 212 may have a function of storing analog data.

The driver circuit 221 has a function of selecting the memory cell 212. Specifically, the driver circuit 221 has a function of supplying a signal for selecting a memory cell 212 which is subjected to data writing or reading (hereinafter also referred to as a selection signal) to a wiring connected to the memory cell 212.

The driver circuit 222 has a function of writing data to the memory cell 212 and a function of reading out data stored in the memory cell 212. Specifically, the driver circuit 222 has a function of supplying a potential (hereinafter also referred to as a writing potential) corresponding to data stored in the memory cell 212 to the wiring BL connected to the memory cell 212 to which data is to be written. Furthermore, the driver circuit 222 has a function of reading a potential corresponding to data stored in the memory cell 212 (hereinafter also referred to as a reading potential) and outputting the potential to the control circuit 111 through the wiring CL An address signal, a clock signal, a timing signal, and the like are input from the control circuit 111 provided in the layer 100 to the driver circuit 221 through the wiring CL. The driver circuit 221 generates a selection signal with the use of these signals. Note that the timing at which a selection signal is output from the driver circuit 221 is controlled by a timing signal input from the control circuit 111.

In addition, an address signal, a clock signal, a timing signal, data to be written to the memory cell 212, and the like are supplied from the control circuit 111 provided in the layer 100 to the driver circuit 222 through the wiring CL. The driver circuit 222 generates writing potentials with the use of these signals. Note that the timing at which the writing potential is output from the driver circuit 222 is controlled by the timing signal input from the control circuit 111.

Note that in FIG. 1(B), wirings CL connected to the driver circuit 221 and the driver circuit 222 are illustrated as one wiring.

The memory cell 212, the driver circuit 221, and the driver circuit 222 are formed with OS transistors. An oxide semiconductor has a bandgap of 2.5 eV or larger, preferably 3.0 V or larger; thus, an OS transistor has a low leakage current due to thermal excitation and also has an extremely low off-state current. Note that off-state current refers to current that flows between a source and a drain when a transistor is off.

An oxide semiconductor used in a channel formation region of a transistor is preferably an oxide semiconductor containing at least one of indium (In) and zinc (Zn). Typical examples of such an oxide semiconductor include an In-M-Zn oxide (an element M is Al, Ga, Y, or Sn, for example). Reducing both impurities serving as electron donors, such as moisture or hydrogen, and oxygen vacancies can make an oxide semiconductor i-type (intrinsic) or substantially i-type. Such an oxide semiconductor can be referred to as a highly purified oxide semiconductor. Note that the details of an OS transistor will be described in Embodiment 3.

An OS transistor has an extremely low off-state current and thus is suitably used as a transistor included in the memory cell 212. An off-state current per micrometer of channel width of an OS transistor can be, for example, lower than or equal to 100 zA/μm, lower than or equal to 10 zA/μm, lower than or equal to 1 zA/μm, or lower than or equal to 10 yA/μm. The use of an OS transistor in the memory cell 212 enables data stored in the memory cell 212 can be retained for a long time.

With the use of an OS transistor for the memory cell 212, the refresh rate of the memory cell 212 can be reduced. Alternatively, refresh operation of the memory cell 212 can be unnecessary. In addition, the low refresh rate of the memory cell 212 can reduce the power consumption of the memory device 210. Alternatively, eliminating the need for the refresh operation of the memory cell 212 can reduce circuits needed for the refresh operation.

Owing to an extremely low leakage current of an OS transistor, the memory cell 212 can retain multilevel data or analog data. Since off-state current of the OS transistor is not easily increased even at high temperatures, data stored in the memory cell 212 is less likely to be lost even at high temperatures caused by heat generation by the signal processing circuit 110 or the image sensor 310. The use of an OS transistor can increase the reliability of the memory device 210.

Figure 2A:
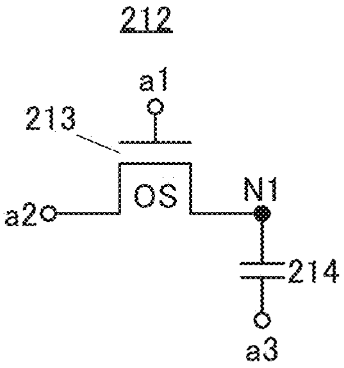
FIGS. 2A-2C are circuit diagrams illustrating configuration examples of a memory cell.

FIG. 2(A) is a circuit diagram illustrating a configuration example of the memory cell 212 including an OS transistor. The memory cell 212 illustrated in FIG. 2(A) includes a transistor 213 and a capacitor 214. Note that “OS” in drawings indicates an OS transistor.

A gate of the transistor 213 is connected to a node a1, one of a source and a drain thereof is connected to one electrode of the capacitor 214, and the other of the source and the drain thereof is connected to a node a2. The other electrode of the capacitor 214 is connected to a node a3 to which a constant potential (e.g., a low power supply potential) is supplied. The node a1 is connected to the driver circuit 221 in FIG. 1(B), and the node a2 is connected to the driver circuit 222 in FIG. 1(B). Note that a node that is connected to the one of the source and the drain of the transistor 213 and the one electrode of the capacitor 214 is referred to as a node N1.

When data is written to the memory cell 212, a writing potential is supplied to the node a2. Then, a selection signal (high-level potential) is supplied to the node a1 to turn on the transistor 213. As a result, the writing potential is written to the node N1. After that, a low-level potential is supplied to the node a1 to turn off the transistor 213. As a result, the node N1 is brought into a floating state and the writing potential is retained.

When data stored in the memory cell 212 is read out, the potential of the node N1 is a reading potential. A selection signal (high-level potential) is supplied to the node a1 to turn on the transistor 213. Accordingly, the potential of the node a2 is determined in accordance with the potential of the node N1. In this manner, data stored in the memory cell 212 is read out.

Since an OS transistor is used as the transistor 213, the potential of the node N1 is held for a long period. Accordingly, the data refresh rate can be reduced and thus power consumption can be reduced. The memory device 210 including the memory cells 212 with a circuit illustrated in FIG. 2(A) is referred to as a DOSRAM in this specification and the like.

Figure 2B:
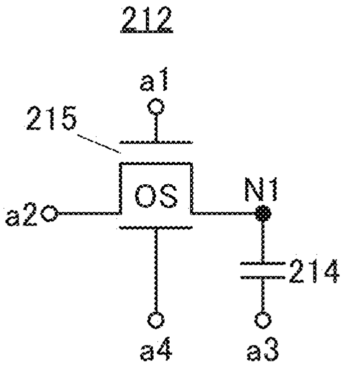

For the memory cell 212, a transistor having a back gate may be used. FIG. 2(B) illustrates a configuration example of the memory cell 212 including a transistor 215 having a back gate. The memory cell 212 illustrated in FIG. 2(B) includes the transistor 215 and the capacitor 214.

The back gate of the transistor 215 is connected to a node a4. By applying a given potential to the node a4, a threshold voltage of the transistor 215 can be increased or decreased. For example, when a negative potential (a potential which is lower than the potentials of the node a2 and the node N1) is applied to the back gate, the threshold voltage can be increased and the off-state current can be reduced.

Figure 2C:
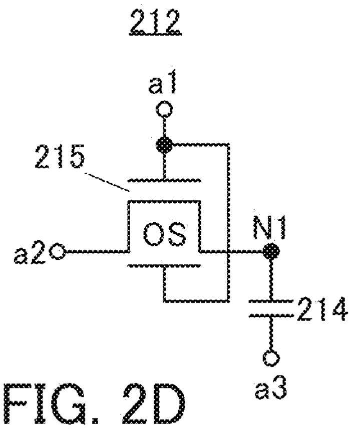

As illustrated in FIG. 2(C), the back gate of the transistor 215 may be connected to the node a1. When the back gate of the transistor 215 is connected to the node a1, the amount of current flowing through the transistor 215 can be increased when the transistor 215 is in an on state. Note that the description except for the back gate in FIGS. 2(B) and 2(C) is similar to that in FIG. 2(A) and thus omitted.

Like the memory cell 212, the driver circuit 221 and the driver circuit 222 illustrated in FIG. 1(B) are also formed with OS transistors. That is, the memory cell 212, the driver circuit 221, and the driver circuit 222 do not include Si transistors and are formed with n-channel OS transistors. A circuit formed with transistors having the same polarity is hereinafter also referred to as a single-polarity circuit. That is, the layer 200 includes the memory device 210 including the single-polarity circuit using OS transistors.

Note that the control circuit 111 for controlling the memory device 210 is provided in the layer 100, and can be formed with a CMOS circuit or the like including Si transistors. Accordingly, the control circuit 111 with high operation speed and high performance can be formed and the memory device 210 can be operated with the use of the control circuit 111.

Although the configuration in which OS transistors are used in the circuit provided in the layer 200 is described above, a transistor whose channel formation region is formed in a film containing a semiconductor material other than an oxide semiconductor may be used. Examples of such a transistor include a transistor using an amorphous silicon film, a microcrystalline silicon film, a polycrystalline silicon film, a single crystal silicon film, an amorphous germanium film, a microcrystalline germanium film, a polycrystalline germanium film, or a single crystal germanium film for a semiconductor layer.

<Image Sensor 310>

The image sensor 310 is formed using a transistor formed over a semiconductor substrate SUB2. The semiconductor substrate SUB2 is not particularly limited as long as a channel region of a transistor can be formed thereon. The description of the semiconductor substrate SUB2 is similar to that of the semiconductor substrate SUB1 and thus is omitted. In this embodiment, a case where a single crystal silicon substrate is used as the semiconductor substrate SUB2 will be described as an example.

The image sensor 310 is connected to the control circuit 112 by electrical connections between the wiring CL that connects the layer 100 to the layer 200, a conductor 201 provided on an outermost surface of the layer 200, and a conductor 301 provided on an outermost surface of the layer 300. Input/output of data and signals between the image sensor 310 and the control circuit 112 is performed through the wiring CL, the conductor 201, and the conductor 301.

Here, the surface of the layer 200 is a surface where the memory device 210 is formed, and the surface of the layer 300 is a surface where the image sensor 310 is formed. In other words, the layer 300 is stacked over the layer 200 such that the surface where the image sensor 310 is formed is in contact with the surface where the memory device 210 is formed.

The image sensor 310 includes a pixel array 311, a driver circuit 321, and a driver circuit 322. The pixel array 311 includes a plurality of pixels 312 arranged in a matrix.

The pixel 312 has a function of converting light intensity into an electric signal. An electric signal obtained by the plurality of pixels 312 is read out by the driver circuit 322 and output as image data from the image sensor 310 to the control circuit 112.

Here, since the layer 300 is stacked such that the surface where the image sensor 310 is formed is in contact with the surface where the memory device 210 is formed, light 20 enters from a surface of the layer 300 where the image sensor 310 is not formed (see FIG. 1(B)). For this reason, the layer 300 is thin enough to transmit light.

The driver circuit 321 has a function of selecting the pixels 312. Specifically, the driver circuit 321 has a function of supplying a selection signal for selecting the pixels 312 on which data reading is to be performed, to a wiring connected to the pixels 312.

The driver circuit 322 has a function of reading out an electric signal from the pixel 312. The driver circuit 322 may have a function of performing noise removal, analog-digital conversion, or the like with respect to the read-out electric signal. For example, in some cases, a CDS (Correlated Double Sampling) circuit may be included as a circuit for noise removal, and a column-parallel (column type) analog-digital conversion circuit may be included as a circuit for performing analog-digital conversion.

The analog-digital conversion circuit is provided in the driver circuit 322 or the control circuit 112 provided in the layer 100. Alternatively, the analog-digital conversion circuit may be provided in each of the driver circuit 322 and the control circuit 112. With the use of the analog-digital conversion circuit, image data generated by the image sensor 310 can be processed as a digital signal.

A clock signal, a timing signal, and the like are input from the control circuit 112 provided in the layer 100 to the driver circuit 321 through the wiring CL, the conductor 201, and the conductor 301. The driver circuit 321 generates a selection signal with the use of these signals. Note that the timing at which a selection signal is output from the driver circuit 321 is controlled by the timing signal input from the control circuit 112.

The driver circuit 322 has a function of outputting an electric signal read out from the pixel 312 as image data. The driver circuit 322 outputs image data to the control circuit 112 through the conductor 301, the conductor 201, and the wiring CL.

Note that in FIG. 1(B), the wirings CL connected to the driver circuit 321 and the driver circuit 322 are illustrated as one wiring, and the conductors 201 and the conductors 301 are each collectively illustrated.

<Pixel 312>

Figure 2D:
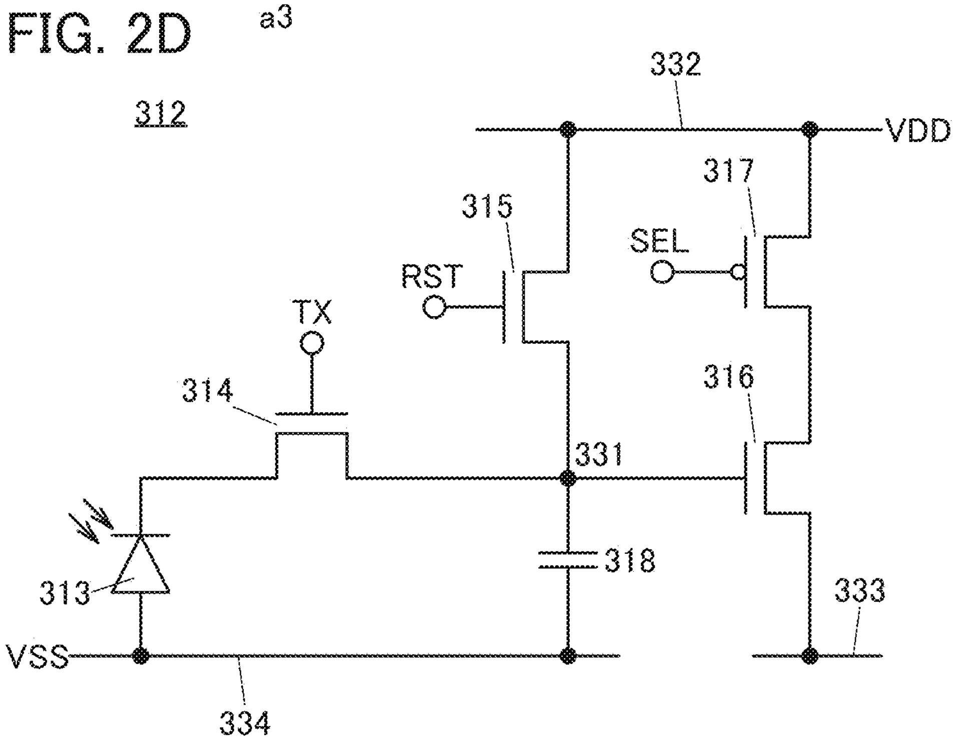
FIG. 2D is a circuit diagram illustrating a configuration example of a pixel.

FIG. 2(D) is a circuit diagram illustrating a configuration example of the pixel 312. The pixel 312 illustrated in FIG. 2(D) includes a photoelectric conversion element 313, a transistor 314, a transistor 315, a transistor 316, a transistor 317, and a capacitor 318.

As the photoelectric conversion element 313, for example, a pn-junction photodiode using a p-type silicon semiconductor and an n-type silicon semiconductor can be used. The photoelectric conversion element 313 may be a pin-junction photodiode in which an i-type silicon semiconductor layer is provided between a p-type silicon semiconductor and an n-type silicon semiconductor. Alternatively, a pin diode element using an amorphous silicon film or a microcrystalline silicon film, a diode-connected transistor, or a variable resistor utilizing a photoelectric effect may be formed using silicon, germanium, selenium, or the like.

A material capable of generating electric charge by absorbing radiation may be used for the photoelectric conversion element 313. Examples of the material capable of generating electric charge by absorbing radiation include lead iodide, mercury iodide, gallium arsenide, CdTe, and CdZn.

One of a source and a drain of the transistor 314 is electrically connected to a cathode of the photoelectric conversion element 313, and the other thereof is electrically connected to the node 331 (charge accumulation portion). An anode of the photoelectric conversion element 313 is electrically connected to a wiring 334.

One of a source and a drain of the transistor 315 is electrically connected to the node 331, and the other of the source and the drain of the transistor 315 is electrically connected to a wiring 332. Agate of the transistor 316 is electrically connected to the node 331, one of a source and a drain of the transistor 316 is electrically connected to a wiring 333, and the other of the source and the drain of the transistor 316 is electrically connected to one of a source and a drain of the transistor 317. The other of the source and the drain of the transistor 317 is electrically connected to the wiring 332. One electrode of the capacitor 318 is electrically connected to the node 331, and the other electrode of the capacitor 318 is electrically connected to the wiring 334.

The transistor 314 has a function as a transfer transistor. A gate of the transistor 314 is supplied with a transfer signal TX. The transistor 315 has a function as a reset transistor. A gate of the transistor 315 is supplied with a reset signal RST. The transistor 316 has a function as an amplifier transistor. The transistor 317 has a function as a selection transistor. A gate of the transistor 317 is supplied with a selection signal SEL.

A high power supply potential VDD is supplied to the wiring 332, and a low power supply potential VSS is supplied to the wiring 334. Here, in this specification and the like, a high power supply potential is a power supply potential higher than a low power supply potential. The low power supply potential is a power supply potential lower than the high power supply potential.

Next, operation of the pixel 312 illustrated in FIG. 2(D) will be described.

First, the transistor 315 is turned on so that VDD is supplied to the node 331 (reset operation). Then, the transistor 315 is turned off so that VDD is retained at the node 331.

Next, the transistor 314 is turned on so that the potential of the node 331 is changed in accordance with the amount of light received by the photoelectric conversion element 313 (accumulation operation). After that, the transistor 314 is turned off so that the potential of the node 331 is retained.

Then, the transistor 317 is turned on so that a potential corresponding to the potential of the node 331 is output from the wiring 333 (selection operation). By measuring the potential of the wiring 333, the amount of light received by the photoelectric conversion element 313 can be determined.

The above operation is performed in all the pixels 312 included in the pixel array 311, and the driver circuit 322 reads out an electric signal; thus, the image sensor 310 can generate image data.

Note that the above configuration of the pixel 312 is an example, and does not include part of the circuit, part of the transistors, part of the capacitor, or the like in some cases. Alternatively, a circuit, a transistor, a capacitor, or the like that is not included in the above configuration of the pixel 312 is included in some cases. Alternatively, some of the power supply potentials may be different.

<Imaging Device 10>

As described above, the imaging device 10 has a structure in which the layer 200 is stacked over the layer 100 and the layer 300 is stacked over the layer 200, and includes the signal processing circuit 110, the memory device 210, and the image sensor 310. The imaging device 10 performs analog-digital conversion, noise removal, or the other various image processing on the image data generated by the image sensor 310, and then can output data to an electronic device including the imaging device 10. Accordingly, the electronic device including the imaging device 10 can be reduced in size and weight.

The structure in which the imaging device 10 includes the memory device 210 including OS transistors and data of a captured image is stored in the memory device 210 enables high-speed imaging exceeding a speed of transmitting and receiving data (a data transferring speed) between the input/output circuit 114 and an electronic device including the imaging device 10.

Figure 3:
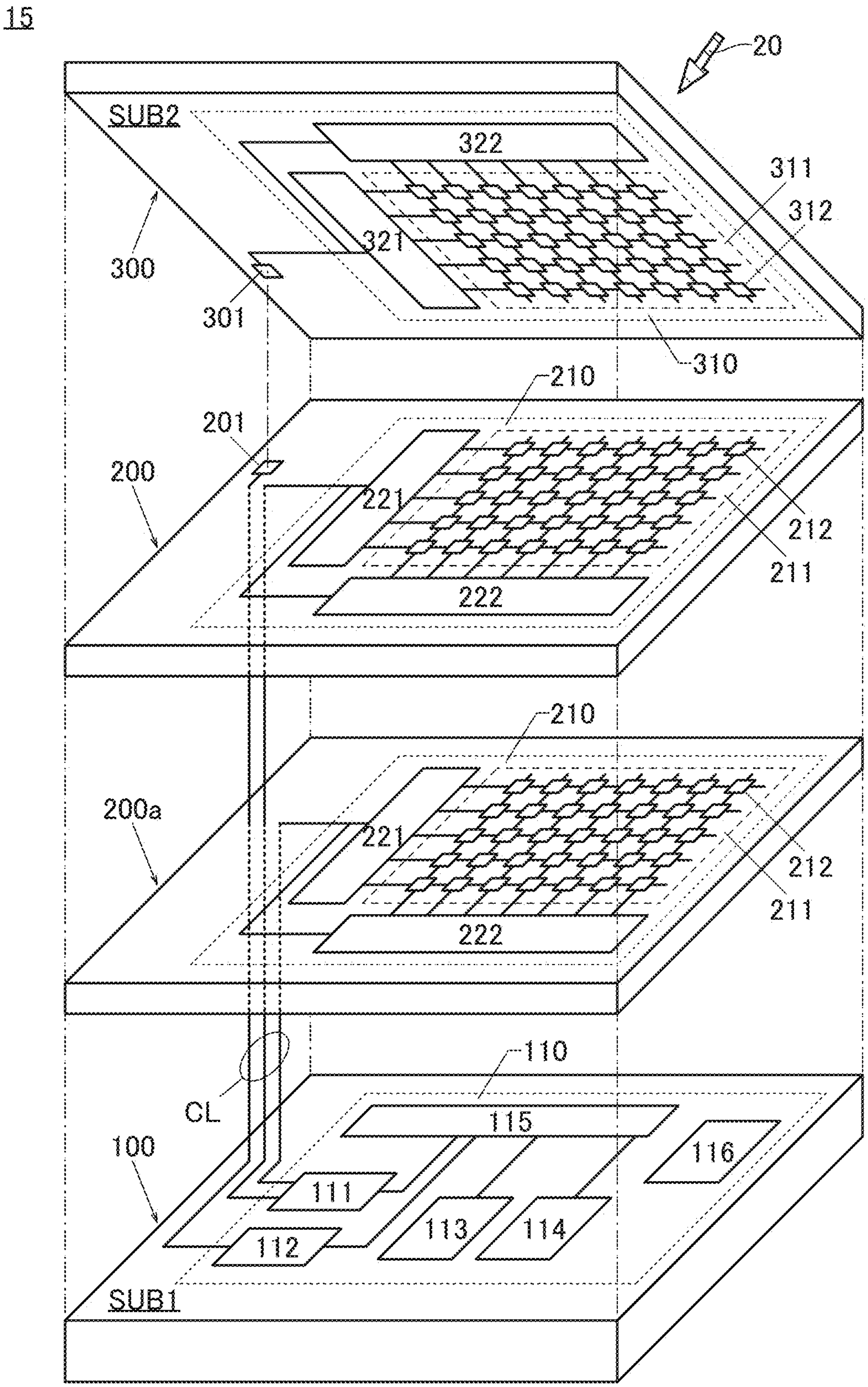
FIG. 3 is a perspective view illustrating a structure example of an imaging device.

Since OS transistors can be formed over the layer 100, the number of steps for bonding and steps for film thickness reduction can be smaller than that in the method of manufacturing an imaging device described in Non-Patent Document 1. The imaging device 10 may include a plurality of layers 200. FIG. 3 illustrates an example in which the imaging device 10 includes two layers 200. An imaging device 15 illustrated in FIG. 3 includes the layer 100, a layer 200*a*, the layer 200, and the layer 300. Although the description of the layer 200*a*, which is the same as the layer 200 except that it does not include the conductor 201, is omitted, the storage capacity of the imaging device 10 can be easily increased by an increase in the number of layers 200.

Owing to an extremely low leakage current of the OS transistor included in the memory device 210, data stored in the memory cell 212 can be retained for a long time. This can make the refresh rate of the memory cell 212 low or refresh operation unnecessary; accordingly, the power consumption of the memory device 210 can be reduced. Moreover, the OS transistor does not easily increase the off-state current even at high temperatures; thus, data stored in the memory cell 212 is unlikely to be lost even at high temperatures. That is, the reliability of the memory device 210 can be increased.

Note that this embodiment can be implemented in combination with the other embodiments described in this specification as appropriate.

Embodiment 2

In this embodiment, a cross-sectional structure example of the imaging device 10 described in the above embodiment will be described.

Note that the signal processing circuit 110 includes transistors formed on the semiconductor substrate SUB1 and the image sensor 310 includes transistors formed on the semiconductor substrate SUB2, that is, transistors of the layer 100 and transistors of the layer 300 are formed on the different semiconductor substrates. Since the memory device 210 includes OS transistors and the layer 200 is formed over the layer 100, the layer 200 is formed above the semiconductor substrate SUB1.

Figure 4:
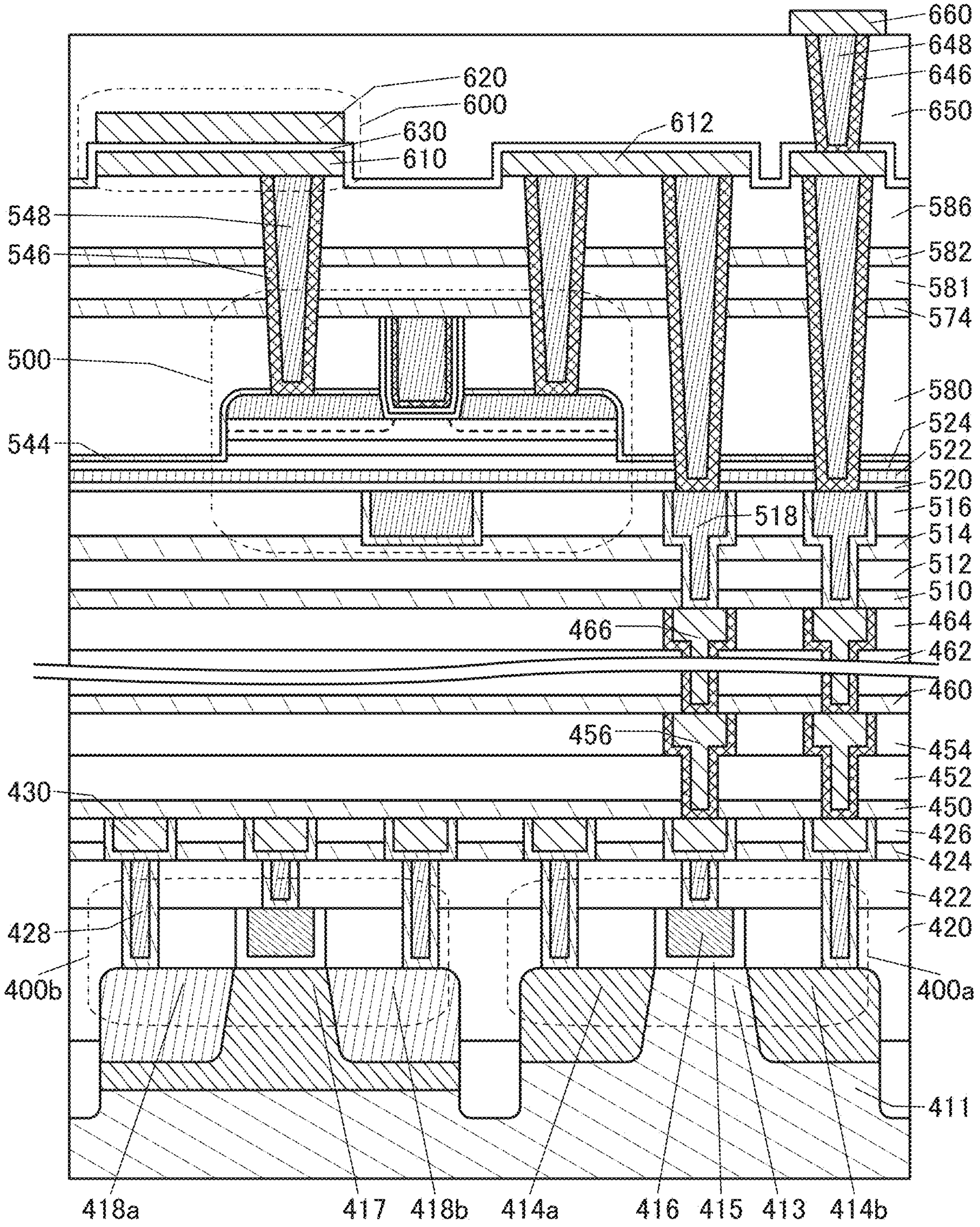
FIG. 4 is a cross-sectional view illustrating a structure example of a layer 100 and a layer 200.
Figure 5A:
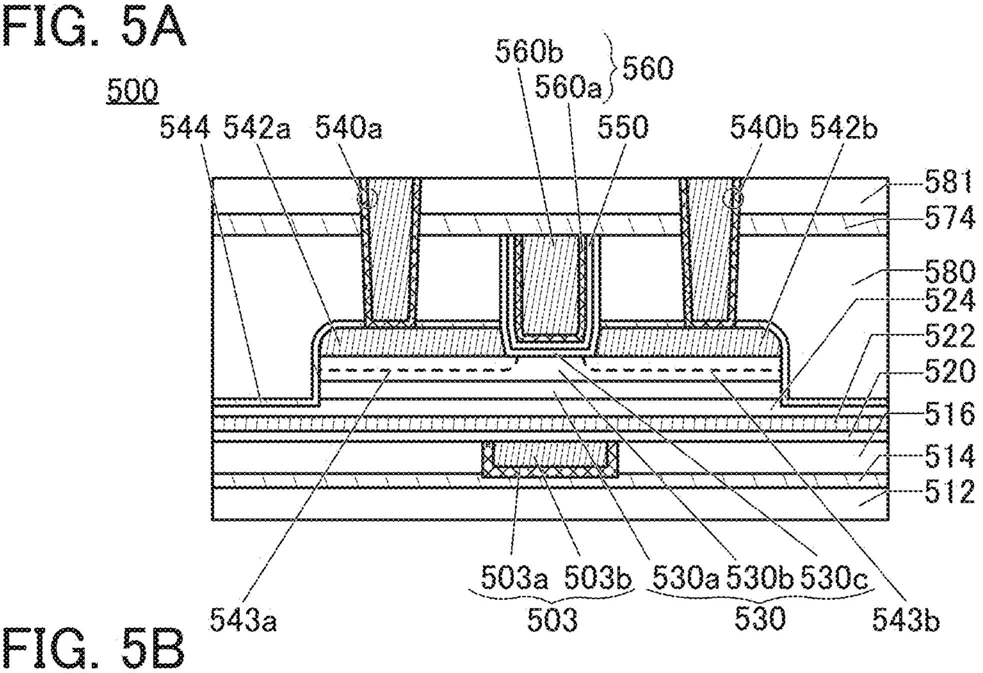
FIGS. 5A-5C are cross-sectional views illustrating structure examples of transistors.
Figure 5B:
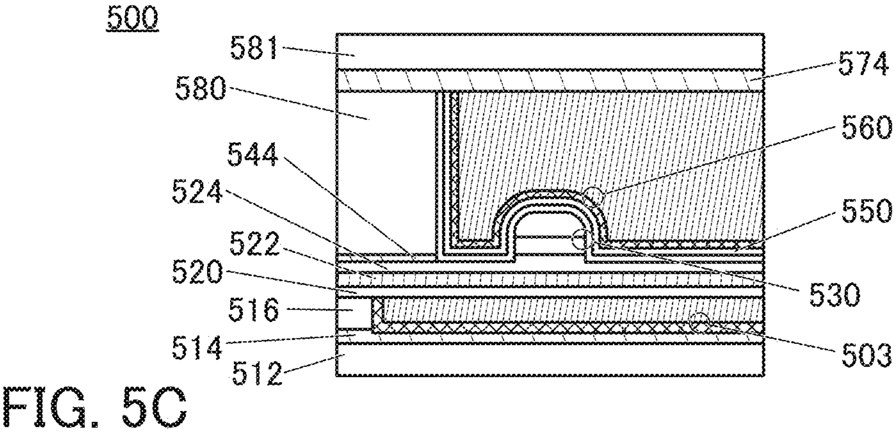
Figure 5C:
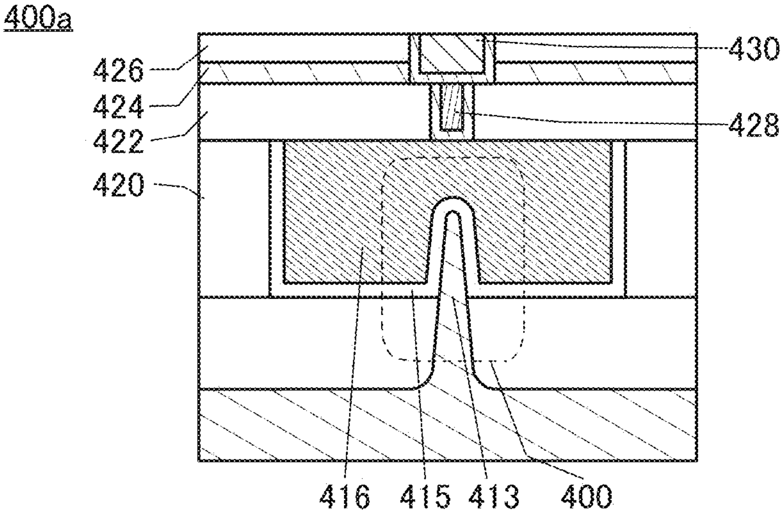
Figure 6:
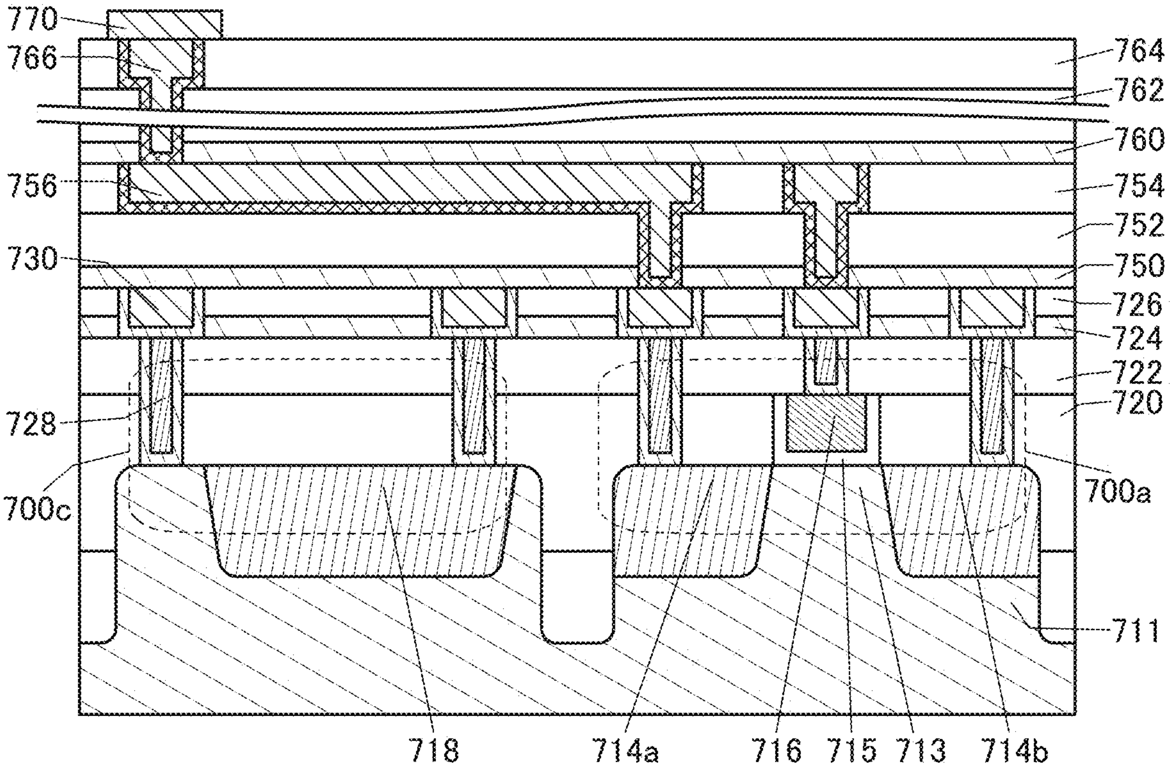
FIG. 6 is a cross-sectional view illustrating a structure example of an imaging device.

FIG. 4 and FIG. 5 illustrate a cross-sectional structure example of the layer 100 and the layer 200, and FIG. 6 illustrates a cross-sectional structure example of the layer 300.

<Layer 100 and Layer 200>

The cross-sectional structure example of the layers 100 and 200 illustrated in FIG. 4 includes a transistor 400*a*, a transistor 400*b*, a transistor 500, and a capacitor 600. FIG. 5(A) is a cross-sectional view of the transistor 500 in the channel length direction. FIG. 5(B) is a cross-sectional view of the transistor 500 in the channel width direction. FIG. 5(C) is a cross-sectional view of the transistor 400*a* in the channel width direction.

The transistor 500 is a transistor including a metal oxide in its channel formation region. Since the off-state current of the transistor 500 is extremely low, the memory cell 212 including the transistor 500 can retain stored data for a long time. In other words, power consumption of the memory device 210 can be reduced because the refresh operation rate is low or the refresh operation is unnecessary.

As illustrated in FIG. 4, the transistor 500 is provided above the transistor 400*a* and the transistor 400*b*, and the capacitor 600 is provided above the transistor 500.

The transistor 400*a* is provided over a semiconductor substrate 411 and includes a conductor 416, an insulator 415, a semiconductor region 413 that is formed of part of the substrate 411, and a low-resistance region 414*a* and a low-resistance region 414*b* functioning as a source region and a drain region. Similarly, the transistor 400*b* is provided on the semiconductor substrate 411 and includes a conductor 416, an insulator 415, a semiconductor region 417 that is formed of part of the semiconductor substrate 411, and a low-resistance region 418*a* and a low-resistance region 418*b* functioning as a source region and a drain region. Note that the semiconductor substrate 411 corresponds to the semiconductor substrate SUB1 in Embodiment 1.

As illustrated in the cross-sectional view of the transistor 400*a* in the channel width direction in FIG. 5C, a top surface and a side surface in the channel width direction of the semiconductor region 413 are covered with the conductor 416 with the insulator 415 therebetween. Thus, the transistors 400*a* and 400*b* are Fin-type transistors. The effective channel width is increased in the Fin-type transistors used as the transistors 400*a* and 400*b*, whereby the on-state characteristics of the transistors can be improved. In addition, since contribution of electric fields of a gate electrode can be increased, the off-state characteristics of the transistors 400*a* and 400*b* can be improved.

Note that in this embodiment, an n-type single crystal silicon substrate is used as the semiconductor substrate 411, for example. The semiconductor region 417 is part of a well of a p-type semiconductor provided in part of the semiconductor substrate 411. That is, the transistor 400*a* functions as a p-channel transistor, and the transistor 400*b* functions as an n-channel transistor.

The semiconductor substrate 411 may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 400 may be an HEMT (High Electron Mobility Transistor) with GaAs and GaAlAs, or the like.

The low-resistance regions 414*a* and 414*b* and the semiconductor region 417 contain an element which imparts p-type conductivity, such as boron, in addition to a semiconductor material used for the semiconductor region 413. The low-resistance regions 418*a* and 418*b* contain an element which imparts n-type conductivity, such as arsenic or phosphorus, in addition to a semiconductor material used for the semiconductor region 417.

The conductor 416 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, threshold voltage of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 400*a* and the transistor 400*b* illustrated in FIG. 4 is just an example and the structure is not limited thereto; an appropriate transistor can be used in accordance with a circuit configuration or a driving method. For example, like the transistor 500, the transistor 400*a* and the transistor 400*b* may be formed using an oxide semiconductor.

An insulator 420, an insulator 422, an insulator 424, and an insulator 426 are stacked in this order to cover the transistor 400*a* and the transistor 400*b*.

The insulator 420, the insulator 422, the insulator 424, and the insulator 426 can be formed using, for example, silicon oxide, silicon oxynitride, silicon nitride oxide, silicon nitride, aluminum oxide, aluminum oxynitride, aluminum nitride oxide, or aluminum nitride.

The insulator 422 may have a function as a planarization film for planarizing a level difference caused by the transistor 400*a* or the like provided below the insulator 422. For example, a top surface of the insulator 422 may be planarized by planarization treatment using a chemical mechanical polishing (CMP) method or the like to improve planarity.

The insulator 424 is preferably formed using a film having a barrier property that prevents diffusion of hydrogen or impurities from the semiconductor substrate 411, the transistor 400*a*, or the like into a region where the transistor 500 is provided. For example, for the film having a barrier property against hydrogen, silicon nitride formed by a CVD method can be used.

The diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistors 400*a* and 400*b*. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 424 that is converted into hydrogen atoms per area of the insulator 424 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of the insulator 426 is preferably lower than that of the insulator 424. For example, the dielectric constant of the insulator 426 is preferably lower than 4, further preferably lower than 3. The dielectric constant of the insulator 426 is, for example, preferably 0.7 times or less, further preferably 0.6 times or less the dielectric constant of the insulator 424. When a material with a low permittivity is used for an interlayer film, the parasitic capacitance generated between wirings can be reduced.

A conductor 428, a conductor 430, and the like that are connected to the capacitor 600 or the transistor 500 are embedded in the insulator 420, the insulator 422, the insulator 424, and the insulator 426. Note that the conductor 428 and the conductor 430 have a function as a plug or a wiring.

Here, a plurality of conductors that has a function as plugs or wirings are collectively denoted by the same reference numeral in some cases. Furthermore, in this specification and the like, a wiring and a plug connected to the wiring may be a single component. That is, there are cases where part of a conductor functions as a wiring and another part of the conductor functions as a plug.

As a material of each of plugs and wirings (the conductor 428, the conductor 430, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 426 and the conductor 430. For example, in FIG. 4 an insulator 450, an insulator 452, and an insulator 454 are provided to be stacked in this order. Furthermore, a conductor 456 is formed in the insulator 450, the insulator 452, and the insulator 454. The conductor 456 has a function as a plug or a wiring that is connected to the transistor 400*a* and the like. Note that the conductor 456 can be provided using a material similar to those for the conductor 428 and the conductor 430.

For example, like the insulator 424, the insulator 450 is preferably formed using an insulator having a barrier property against hydrogen. Furthermore, the conductor 456 preferably contains a conductor having a barrier property against hydrogen. In this case, the conductor having a barrier property against hydrogen is formed in an opening of the insulator 450 having a barrier property against hydrogen. With this structure, the transistor 400*a*, the transistor 400*b*, and the transistor 500 can be separated by a barrier layer, so that the diffusion of hydrogen from the transistor 400*a* and the transistor 400*b* into the transistor 500 can be inhibited.

Note that for the conductor having a barrier property against hydrogen, tantalum nitride is preferably used, for example. The use of a stack including tantalum nitride and tungsten having high conductivity can inhibit the diffusion of hydrogen from the transistor 400*a* and the transistor 400*b* while the conductivity of a wiring is kept. In that case, the tantalum nitride layer having a barrier property against hydrogen is preferably in contact with the insulator 450 having a barrier property against hydrogen.

A wiring layer may be provided over the insulator 454 and the conductor 456. For example, in FIG. 4, an insulator 460, an insulator 462, and an insulator 464 are provided to be stacked in this order. Furthermore, a conductor 466 is formed in the insulator 460, the insulator 462, and the insulator 464. The conductor 466 has a function as a plug or a wiring. Note that the conductor 466 can be provided using a material similar to those for the conductor 428 and the conductor 430.

For example, like the insulator 424, the insulator 460 is preferably formed using an insulator having a barrier property against hydrogen. Furthermore, the conductor 466 preferably contains a conductor having a barrier property against hydrogen. In this case, the conductor having a barrier property against hydrogen is formed in an opening of the insulator 460 having a barrier property against hydrogen. With this structure, the transistor 400*a*, the transistor 400*b*, and the transistor 500 can be separated by a barrier layer, so that the diffusion of hydrogen from the transistor 400*a* and the transistor 400*b* into the transistor 500 can be inhibited.

Although a wiring layer including the conductor 456 and a wiring layer including the conductor 466 are described in the above, the cross-sectional structures of the layer 100 and the layer 200 are not limited to this. A wiring layer which is similar to the wiring layer including the conductor 456 may be provided, or three or more wiring layers which are similar to the wiring layer including the conductor 456 may be provided.

Here, a gate of the transistor 400*a* is electrically connected to one of a source and a drain of the transistor 500 through the conductor 428, the conductor 430, the conductor 456, the conductor 466, and the like. This series of wirings corresponds to the wiring CL in Embodiment 1.

An insulator 510, an insulator 512, an insulator 514, and an insulator 516 are provided to be stacked in this order over the insulator 464. A substance having a barrier property against oxygen or hydrogen is preferably used for one of the insulator 510, the insulator 512, the insulator 514, and the insulator 516.

For example, the insulator 510 and the insulator 514 are preferably formed using a film having a barrier property that prevents diffusion of hydrogen or impurities from the semiconductor substrate 411, the regions where the transistor 400*a* and the transistor 400*b* are provided, or the like into the region where the transistor 500 is provided. Therefore, a material similar to that for the insulator 424 can be used.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 420, for example. When a material with a relatively low permittivity is used for the insulator, the parasitic capacitance between wirings can be reduced. A silicon oxide film, a silicon oxynitride film, or the like can be used as the insulator 512 and the insulator 516, for example.

A conductor 518, a conductor included in the transistor 500 (a conductor 503 (see FIG. 5(A))), and the like are embedded in the insulator 510, the insulator 512, the insulator 514, and the insulator 516. Note that the conductor 518 functions as a plug or a wiring that is connected to the capacitor 600 or the transistor 400*a*. The conductor 518 can be provided using a material similar to those for the conductor 428 and the conductor 430.

In particular, the conductor 518 in a region in contact with the insulator 510 and the insulator 514 is preferably a conductor having a barrier property against oxygen, hydrogen, and water. With this structure, the transistors 400*a* and 400*b* and the transistor 500 can be separated by the layer having a barrier property against oxygen, hydrogen, and water; thus, the diffusion of hydrogen and the like from the transistor 400*a* and the transistor 400*b* into the transistor 500 can be inhibited.

The transistor 500 is provided above the insulator 516.

As illustrated in FIGS. 5(A) and 5(B), the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530*a* positioned over the insulator 524; an oxide 530*b* positioned over the oxide 530*a*; a conductor 542*a* and a conductor 542*b* positioned apart from each other over the oxide 530*b*; an insulator 580 that is positioned over the conductor 542*a* and the conductor 542*b* and includes an opening overlapping a region between the conductor 542*a* and the conductor 542*b*; a conductor 560 positioned in the opening; an insulator 550 positioned between the conductor 560 and the oxide 530*b*, the conductor 542*a*, the conductor 542*b*, and the insulator 580; and an oxide 530*c* positioned between the insulator 550 and the oxide 530*b*, the conductor 542*a*, the conductor 542*b*, and the insulator 580.

As illustrated in FIGS. 5(A) and 5(B), an insulator 544 is preferably positioned between the insulator 580 and the oxide 530*a*, the oxide 530*b*, the conductor 542*a*, and the conductor 542*b*. In addition, as illustrated in FIGS. 5(A) and 5(B), the conductor 560 preferably includes a conductor 560*a* provided inside the insulator 550 and a conductor 560*b* embedded inside the conductor 560*a*. Moreover, as illustrated in FIGS. 5(A) and 5(B), an insulator 574 is preferably positioned over the insulator 580, the conductor 560, and the insulator 550.

Hereinafter, the oxide 530*a*, the oxide 530*b*, and the oxide 530*c* may be collectively referred to as an oxide 530. The conductor 542*a* and the conductor 542*b* may be collectively referred to as a conductor 542.

The transistor 500 has a structure in which three layers of the oxide 530*a*, the oxide 530*b*, and the oxide 530*c* are stacked in the region where the channel is formed and its vicinity; however, the present invention is not limited thereto. For example, a single layer of the oxide 530*b*, a two-layer structure of the oxide 530*b* and the oxide 530*a*, a two-layer structure of the oxide 530*b* and the oxide 530*c*, or a stacked-layer structure of four or more layers may be provided. Although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 4 and FIGS. 5(A) and 5(B) is an example, and the structure is not limited thereto; an appropriate transistor can be used in accordance with a circuit configuration or a driving method.

Here, the conductor 560 functions as a gate electrode of the transistor, and the conductor 542*a* and the conductor 542*b* function as a source electrode and a drain electrode. As described above, the conductor 560 is formed to be embedded in the opening of the insulator 580 and the region between the conductor 542*a* and the conductor 542*b*. The positions of the conductor 560, the conductor 542*a*, and the conductor 542*b* are selected in a self-aligned manner with respect to the opening of the insulator 580. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, for example, miniaturization and high integration of the memory device 210 provided in the layer 200 can be achieved.

In addition, since the conductor 560 is formed in the region between the conductor 542*a* and the conductor 542*b* in a self-aligned manner, the conductor 560 does not have a region overlapping the conductor 542*a* or the conductor 542*b*. Thus, parasitic capacitance formed between the conductor 560 and each of the conductor 542*a* and the conductor 542*b* can be reduced. As a result, the switching speed of the transistor 500 can be increased, and the transistor 500 can have high frequency characteristics.

The conductor 560 sometimes functions as a first gate (also referred to as top gate) electrode. The conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to be overlapped by the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; a conductor 503*a* is formed in contact with an inner wall of an opening in the insulator 514 and the insulator 516, and a conductor 503*b* is formed on the inner side.

The insulator 520, the insulator 522, the insulator 524, and the insulator 550 have a function of a gate insulator.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide that releases part of oxygen by heating is preferably used. An oxide that releases oxygen by heating is an oxide film in which the amount of released oxygen converted into oxygen atoms is greater than or equal to $1.0\times10^{18}$ atoms/$cm^3$, preferably greater than or equal to $1.0\times10^{19}$ atoms/$cm^3$, further preferably greater than or equal to $2.0\times10^{19}$ atoms/$cm^3$ or greater than or equal to $3.0\times10^{20}$ atoms/$cm^3$ in thermal desorption spectroscopy analysis (TDS analysis). Note that the temperature of the film surface in the TDS analysis is preferably higher than or equal to 100° C. and lower than or equal to 700° C., or higher than or equal to 100° C. and lower than or equal to 400° C.

In the case where the insulator 524 includes an excess-oxygen region, it is preferred that the insulator 522 have a function of inhibiting diffusion of oxygen (e.g., an oxygen atom, an oxygen molecule, or the like) (or that the insulator 522 do not easily transmit the above oxygen).

When the insulator 522 has a function of inhibiting diffusion of oxygen or impurities, oxygen contained in the oxide 530 is not diffused to the insulator 520 side, which is preferable. Furthermore, the conductor 503 can be prevented from reacting with oxygen contained in the insulator 524 or the oxide 530.

For example, the insulator 522 is preferably formed using a single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or (Ba, Sr)$TiO_3$(BST). With miniaturization and high integration of transistors, a problem such as leakage current may arise because of a thinner gate insulator. When a high-k material is used for an insulator functioning as the gate insulator, a gate potential during operation of the transistor can be reduced while the physical thickness of the gate insulator is kept.

It is particularly preferable to use an insulator containing an oxide of one or both of aluminum and hafnium, which is an insulating material having a function of inhibiting diffusion of impurities, oxygen, and the like (or an insulating material through which the oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, when an insulator which is a high-k material is combined with silicon oxide or silicon oxynitride, the insulator 520 having a stacked-layer structure that has thermal stability and a high dielectric constant can be obtained because silicon oxide and silicon oxynitride have thermal stability.

Note that the insulator 520, the insulator 522, and the insulator 524 may each have a stacked-layer structure of four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In-Zn oxide may be used.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530*a* under the oxide 530*b*, it is possible to inhibit diffusion of impurities into the oxide 530*b* from the components formed below the oxide 530*a*. Moreover, including the oxide 530*c* over the oxide 530*b* makes it possible to inhibit diffusion of impurities into the oxide 530*b* from the components formed above the oxide 530*c*.

Note that the oxide 530 preferably has a stacked-layer structure of oxides that differ in the atomic ratio of metal atoms. Specifically, the atomic ratio of the element M to the constituent elements in the metal oxide used for the oxide 530*a* is preferably greater than the atomic ratio of the element M to the constituent elements in the metal oxide used for the oxide 530*b*. Moreover, the atomic ratio of the element M to In in the metal oxide used for the oxide 530*a* is preferably greater than the atomic ratio of the element M to In in the metal oxide used for the oxide 530*b*. Furthermore, the atomic ratio of In to the element Min the metal oxide used for the oxide 530*b* is preferably greater than the atomic ratio of Into the element Min the metal oxide used for the oxide 530*a*. A metal oxide that can be used for the oxide 530*a* or the oxide 530*b* can be used for the oxide 530*c*.

The energy of the conduction band minimum of each of the oxide 530*a* and the oxide 530*c* is preferably higher than the energy of the conduction band minimum of the oxide 530*b*. In other words, the electron affinity of each of the oxide 530*a* and the oxide 530*c* is preferably smaller than the electron affinity of the oxide 530*b*.

The energy level of the conduction band minimum gradually changes at junction portions of the oxide 530*a*, the oxide 530*b*, and the oxide 530*c*. In other words, the energy level of the conduction band minimum at the junction portions of the oxide 530*a*, the oxide 530*b*, and the oxide 530*c* continuously changes or is continuously connected. To obtain this, the density of defect states in a mixed layer formed at an interface between the oxide 530*a* and the oxide 530*b* and an interface between the oxide 530*b* and the oxide 530*c* is preferably made low.

Specifically, when the oxide 530*a* and the oxide 530*b* or the oxide 530*b* and the oxide 530*c* contain the same element (as a main component) in addition to oxygen, a mixed layer with a low density of defect states can be formed. For example, in the case where the oxide 530*b* is an In—Ga—Zn oxide, an In—Ga—Zn oxide, a Ga—Zn oxide, gallium oxide, or the like is preferably used for the oxide 530*a* and the oxide 530*c*.

At this time, the oxide 530*b* serves as a main carrier path. When the oxide 530*a* and the oxide 530*c* have the above structure, the density of defect states at the interface between the oxide 530*a* and the oxide 530*b* and the interface between the oxide 530*b* and the oxide 530*c* can be made low. Thus, the influence of interface scattering on carrier conduction is small, and the transistor 500 can have a high on-state current.

The conductor 542 (the conductor 542*a* and the conductor 542*b*) functioning as the source electrode and the drain electrode is provided over the oxide 530*b*. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 5(A), a region 543 (a region 543*a* and a region 543*b*) is sometimes formed as a low-resistance region at and near the interface between the oxide 530 and the conductor 542. In that case, the region 543*a* functions as one of a source region and a drain region, and the region 543*b* functions as the other of the source region and the drain region. The channel formation region is formed in a region between the region 543*a* and the region 543*b*.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulator. The insulator 550 is preferably positioned in contact with the inner side (the top surface and the side surface) of the oxide 530*c*. The insulator 550 is preferably formed using an insulator from which oxygen is released by heating. For example, the insulator 550 is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in thermal desorption spectroscopy analysis (TDS analysis). Note that the temperature of the film surface in the TDS analysis is preferably higher than or equal to 100° C. and lower than or equal to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

When an insulator from which oxygen is released by heating is provided as the insulator 550 in contact with the top surface of the oxide 530*c*, oxygen can be efficiently supplied from the insulator 550 to the channel formation region of the oxide 530*b* through the oxide 530*c*. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

In order to efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Although the conductor 560 functioning as the first gate electrode has a two-layer structure in FIGS. 5(A) and 5(B), a single-layer structure or a stacked-layer structure of three or more layers may be employed.

For the conductor 560*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., an oxygen atom, an oxygen molecule, and the like). When the conductor 560*a* has a function of inhibiting oxygen diffusion, it is possible to prevent a reduction in conductivity of the conductor 560*b* due to oxidation caused by oxygen contained in the insulator 550. As a conductive material having a function of inhibiting oxygen diffusion, for example, tantalum, tantalum nitride, ruthenium, ruthenium oxide, or the like is preferably used.

The conductor 560*b* is preferably formed using a conductive material containing tungsten, copper, or aluminum as its main component. The conductor 560*b* also functions as a wiring and thus is preferably formed using a conductor having high conductivity. For example, a conductive material containing tungsten, copper, or aluminum as its main component can be used. The conductor 560*b* may have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide, in which an excess-oxygen region can be easily formed in a later step, are preferable.

The insulator 580 preferably includes an excess-oxygen region. When the insulator 580 from which oxygen is released by heating is provided in contact with the oxide 530*c*, oxygen in the insulator 580 can be efficiently supplied to the oxide 530 through the oxide 530*c*. Note that the concentration of impurities such as water or hydrogen in the insulator 580 is preferably lowered.

The opening of the insulator 580 is formed to overlap a region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably lowered.

A conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 420 can be used. When a material with a relatively low permittivity is used for the insulator, the parasitic capacitance between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions as plugs or wirings that are connected to the capacitor 600, the transistor 500, or the transistors 400*a* and 400*b*. The conductor 546 and the conductor 548 can be provided using a material similar to those for the conductor 428 and the conductor 430.

In addition, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each of which has a single-layer structure are illustrated in FIG. 4, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap the conductor 610 with the insulator 630 therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be provided using a material similar to that for the insulator 420. The insulator 650 may function as a planarization film that covers an uneven shape thereunder.

A conductor 646 and a conductor 648 are embedded in the insulator 650. The conductor 646 and the conductor 648 have a function as a plug connected to the transistor 500, the transistor 400*a*, the transistor 400*b*, and the like. The conductor 646 and the conductor 648 can be provided using a material similar to those of the conductor 428 and the conductor 430.

A conductor 660 is provided over the conductor 646 and the conductor 648. The conductor 660 can be provided using a material similar to those of the conductor 612 and the conductor 610. The conductor 660 corresponds to the conductor 201 in Embodiment 1. In other words, electrical connection with the layer 300 can be obtained through the conductor 660.

Note that a layer including an element similar to the transistor 500 and the capacitor 600 may be provided over the transistor 500 and the capacitor 600. When a plurality of layers including the transistor 500 and the capacitor 600 are provided, the storage capacity of the memory device 210 can be increased.

With the use of the above structure, a change in electrical characteristics can be inhibited and reliability can be improved in the layer 200 including a transistor including an oxide semiconductor. Alternatively, a transistor including an oxide semiconductor and having a high on-state current can be provided. Alternatively, a transistor including an oxide semiconductor and having a low off-state current can be provided. Alternatively, the memory device 210 with low power consumption can be provided. Alternatively, the memory device 210 using a transistor including an oxide semiconductor can be miniaturized or highly integrated.

<Layer 300>

FIG. 6 illustrates a cross-sectional structure example of the layer 300. The cross-sectional structure example of the layer 300 in FIG. 6 includes a transistor **700*a* and a pn-junction photodiode 700*c*. Note that the photodiode 700*c* functions as the photoelectric conversion element 313** in Embodiment 1.

The transistor **700*a* is provided over a semiconductor substrate 711 and includes a conductor 716, an insulator 715, a semiconductor region 713 that is formed of part of the semiconductor substrate 711, and a low-resistance region 714*a* and a low-resistance region 714*b* functioning as a source region and a drain region. Note that the semiconductor substrate 711 corresponds to the semiconductor substrate SUB2** in Embodiment 1.

Note that in this embodiment, an n-type single crystal silicon substrate is used as the semiconductor substrate 711, for example. Part of the semiconductor substrate 711 functions as an n-type semiconductor of the photodiode **700*c* and a p-type semiconductor region 718 provided in the semiconductor substrate 711 functions as a p-type semiconductor of the photodiode 700*c*. The transistor 700*a* functions as a p-channel transistor. An n-channel transistor can be formed in a manner similar to that of the above-described transistor 400*b* though not being illustrated in FIG. 6**.

The low-resistance region **714*a*, the low-resistance region 714*b*, and the p-type semiconductor region 718 contain an element that imparts p-type conductivity, such as boron, in addition to a semiconductor material used for the semiconductor region 713**.

The conductor 716 functioning as a gate electrode can be formed using a semiconductor material such as silicon containing the element which imparts n-type conductivity, such as arsenic or phosphorus, or the element which imparts p-type conductivity, such as boron, or using a conductive material such as a metal material, an alloy material, or a metal oxide material.

Note that the work function depends on a material of the conductor; thus, the threshold voltage of the transistor can be adjusted by changing the material of the conductor. Specifically, it is preferable to use a material such as titanium nitride or tantalum nitride for the conductor. Moreover, in order to ensure both conductivity and embeddability, it is preferable to use a stacked layer of metal materials such as tungsten and aluminum for the conductor, and it is particularly preferable to use tungsten in terms of heat resistance.

An insulator 720, an insulator 722, an insulator 724, and an insulator 726 are sequentially stacked to cover the transistor **700*a* and the photodiode 700*c***.

The insulator 720, the insulator 722, the insulator 724, and the insulator 726 can be formed using, for example, silicon oxide, silicon oxynitride, silicon nitride oxide, silicon nitride, aluminum oxide, aluminum oxynitride, aluminum nitride oxide, or aluminum nitride.

The insulator 722 may have a function of a planarization film for eliminating a level difference caused by the transistor **700*a* or the like underlying the insulator 722. For example, a top surface of the insulator 722 may be planarized by planarization treatment using a chemical mechanical polishing (CMIP) method or the like to improve planarity. By the CMP treatment, unevenness of a sample surface can be reduced, and coverage with an insulating layer or a conductive layer to be formed later can be increased. For the insulator 722**, a low-dielectric constant material (a low-k material), a siloxane-based resin, PSG (phosphosilicate glass), BPSG (borophosphosilicate glass), or the like may be used.

A conductor 728, a conductor 730, and the like are embedded in the insulator 720, the insulator 722, the insulator 724, and the insulator 726. Note that the conductor 728 and the conductor 730 have a function as plugs or wirings.

As a material of each of the plugs and wirings (the conductor 728, the conductor 730, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 726 and the conductor 730. For example, in FIG. 6, an insulator 750, an insulator 752, and an insulator 754 are stacked sequentially. Furthermore, a conductor 756 is formed in the insulator 750, the insulator 752, and the insulator 754. The conductor 756 has a function as a plug or a wiring that is connected to the transistor **700*a* or the like. Note that the conductor 756 can be provided using a material similar to those for the conductor 728 and the conductor 730. The insulator 750, the insulator 752, and the insulator 754 can be provided using a material similar to that for the insulator 720** and the like.

A wiring layer may be provided over the insulator 754 and the conductor 756. For example, in FIG. 6, an insulator 760, an insulator 762, and an insulator 764 are provided to be stacked in this order. Furthermore, a conductor 766 is formed in the insulator 760, the insulator 762, and the insulator 764. The conductor 766 has a function as a plug or a wiring. Note that the conductor 766 can be provided using a material similar to those for the conductor 728 and the conductor 730. The insulator 760, the insulator 762, and the insulator 764 can be formed using a material similar to that for the insulator 720 or the like.

Although a wiring layer including the conductor 756 and a wiring layer including the conductor 766 are described in the above, the cross-sectional structure of the layer 300 is not limited to this. A wiring layer which is similar to the wiring layer including the conductor 756 may be provided, or three or more wiring layers which are similar to the wiring layer including the conductor 756 may be provided.

A conductor 770 is provided over the conductor 766. The conductor 770 can be provided using a material similar to those for the conductor 728 and the conductor 730. The conductor 770 corresponds to the conductor 301 in Embodiment 1. In other words, electrical connection with the layer 100 and the layer 200 can be obtained through the conductor 770.

<Imaging Device 10>

Figure 7:
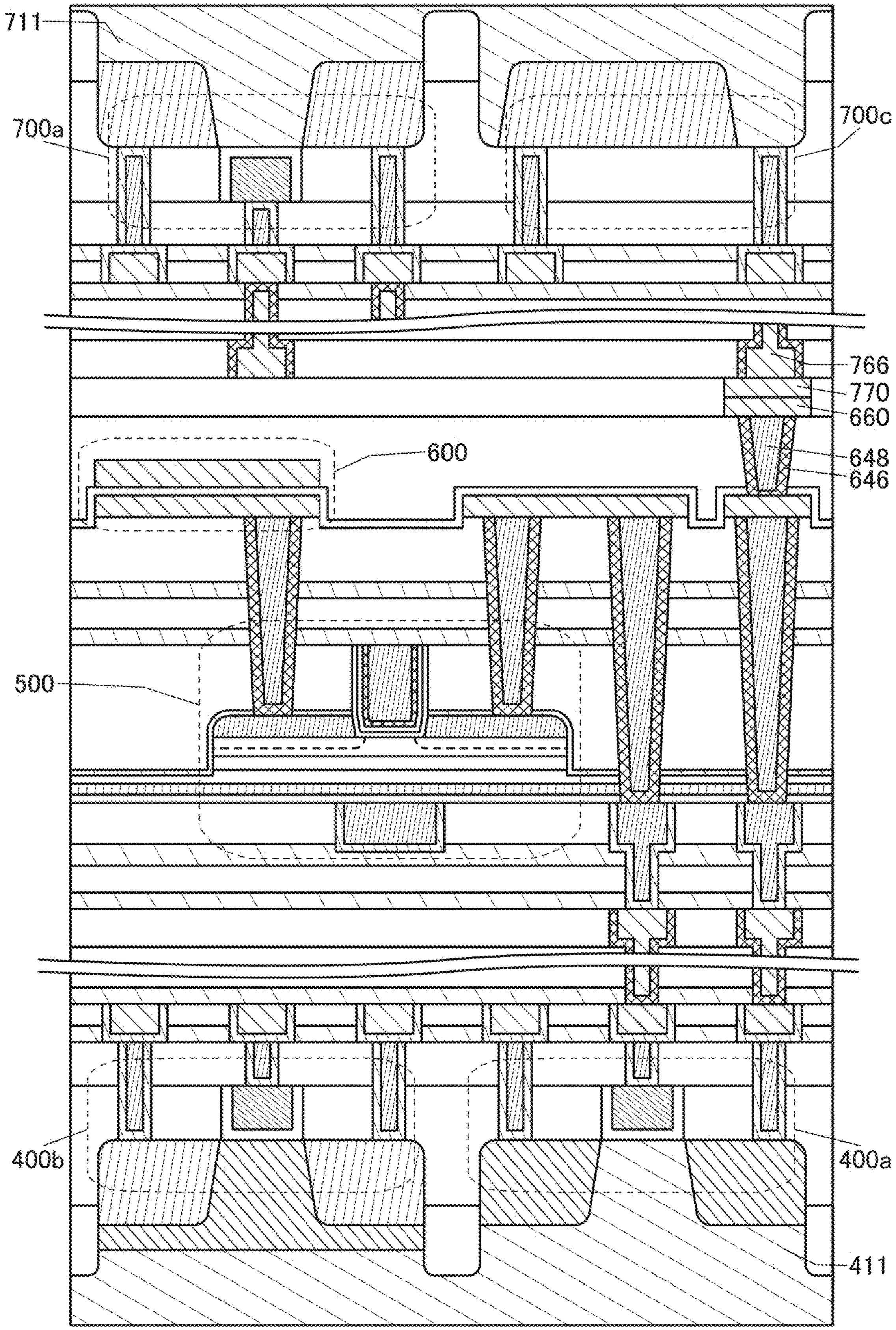
FIG. 7 is a cross-sectional view illustrating a structure example of an imaging device.

The imaging device 10 is formed by bonding the above-described layers 100 and 200 to the layer 300. FIG. 7 illustrates a cross-sectional structure example of the imaging device 10.

The imaging device 10 is formed by bonding surfaces of the layer 100 and the layer 200, over the semiconductor substrate 411, where the transistor 400*a*, the transistor 400*b*, the transistor 500, the capacitor 600, and the like are provided to a surface of the layer 300 where the transistor 700*a*, the photodiode 700*c*, and the like are provided. Note that the imaging device 10 illustrated in FIG. 7 is different from the imaging device 10 in FIG. 4 and FIG. 6 in that some reference numerals, the layer including the conductor 466, and the layer including the conductor 756 are omitted and the scale of part of the drawing is changed.

In FIG. 7, the layers 100 and 200 are bonded to the layer 300, whereby the conductor 660 and the conductor 770 are electrically connected. After the bonding of the layers 100 and 200 to the layer 300, the semiconductor substrate 711 included in the layer 300 is reduced in thickness, whereby the imaging device 10 is formed.

The photodiode 700*c* captures light transmitted through the semiconductor substrate 711 and converts the light to an electric signal. The electric signal converted by the photodiode 700*c* is converted into a digital signal in an analog-digital conversion circuit included in the signal processing circuit 110 or the image sensor 310. The electric signal converted by the photodiode 700*c* is transmitted to the signal processing circuit 110 through the conductor 770 and the conductor 660.

Structure Example 1 of Transistor

Although FIG. 4 and FIG. 5 illustrate a structure example in which the conductor 542 that functions as a source electrode or a drain electrode is in contact with the oxide 530, the structure of the OS transistor is not limited to this. For example, a structure in which the conductor 542 is not provided and the resistance of the oxide 530 is selectively reduced so as to form a source region or a drain region in the oxide 530*b* can be employed. A structure example of such a transistor is illustrated in FIG. 8.

Figure 8A:
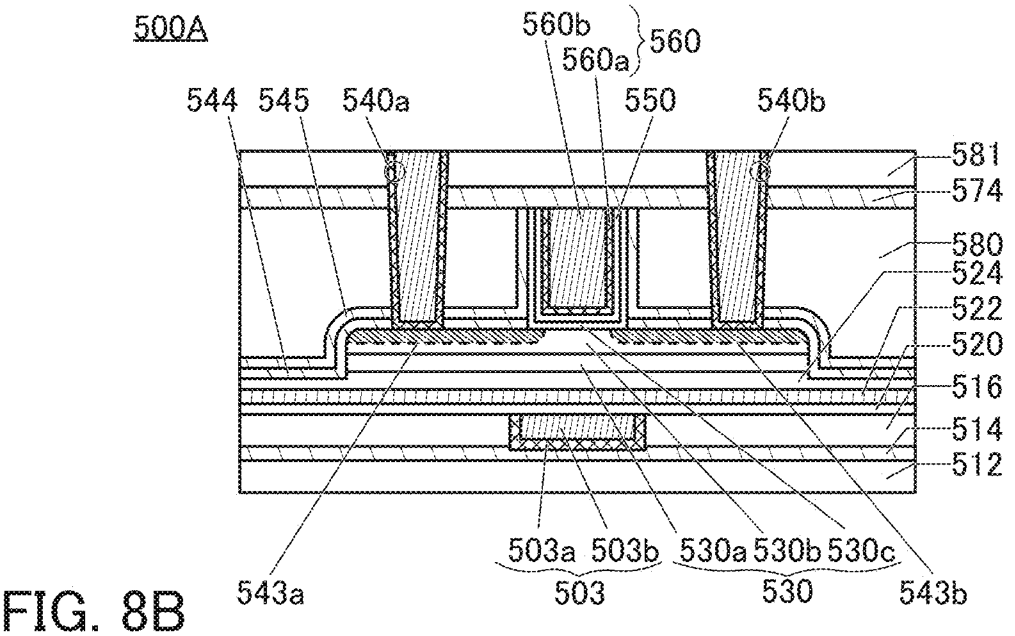
FIGS. 8A and 8B are cross-sectional views illustrating a structure example of a transistor.
Figure 8B:
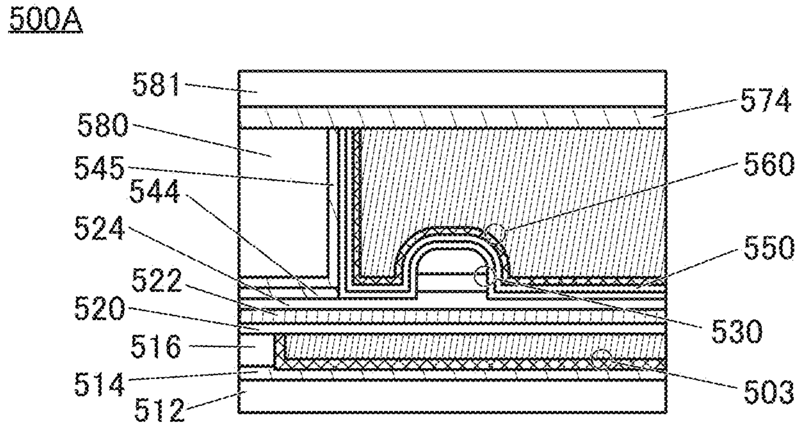

FIG. 8(A) is a cross-sectional view of a transistor 500A in the channel length direction, and FIG. 8(B) is a cross-sectional view of the transistor 500A in the channel width direction. Note that the transistor 500A illustrated in FIG. 8 is a modification example of the transistor 500 illustrated in FIG. 5. Therefore, what is different from the transistor 500 is mainly described to avoid repeated description.

In the transistor 500A, a metal oxide functioning as an oxide semiconductor can be used as the oxide 530 including a channel formation region, as in the transistor 500.

When an element that forms an oxygen vacancy or an element that is bonded to an oxygen vacancy is added to the oxide 530, the carrier density is increased and the resistance is lowered in some cases. Typical examples of an element that lowers the resistance of the oxide 530 include boron and phosphorus. Moreover, hydrogen, carbon, nitrogen, fluorine, sulfur, chlorine, titanium, a rare gas, or the like may be used. Typical examples of the rare gas are helium, neon, argon, krypton, and xenon.

Note that the concentration of the above element is measured by secondary ion mass spectrometry (SIMS) or the like.

Boron and phosphorus are particularly preferable because an apparatus in a manufacturing line for amorphous silicon or low-temperature polysilicon can be used. Using the existing facility can reduce capital investment.

The region 543 (the region 543*a* and the region 543*b*) illustrated in FIG. 8 is a region where the above element is added to the oxide 530*b*. The region 543 can be formed with the use of a dummy gate, for example.

For example, a dummy gate is provided over the oxide 530*b*, and an element that lowers the resistance of the oxide 530*b* is added using the dummy gate as a mask. That is, the element is added to regions of the oxide 530 that are not overlapped by the dummy gate, whereby the region 543 is formed. Note that as a method for adding the element, an ion implantation method by which an ionized source gas is subjected to mass separation and then added, an ion doping method by which an ionized source gas is added without mass separation, a plasma immersion ion implantation method, or the like can be used.

Next, an insulating film to be the insulator 544 and an insulating film to be an insulator 545 may be formed over the oxide 530*b* and the dummy gate. The insulating film to be the insulator 544 and the insulating film to be the insulator 545 are stacked, whereby a region where the region 543 is overlapped by the oxide 530*c* and the insulator 550 can be provided.

Specifically, after an insulating film to be the insulator 580 is provided over the insulating film to be the insulator 545, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 544 in contact with the dummy gate is preferably also removed. Thus, the insulator 545 and the insulator 544 are exposed at the side surface of the opening provided in the insulator 580, and the region 543 provided in the oxide 530*b* is partly exposed at the bottom surface of the opening. Next, an oxide film to be the oxide 530*c*, an insulating film to be the insulator 550, and a conductive film to be the conductor 560 are formed in this order in the opening, and then, the oxide film to be the oxide 530*c*, the insulating film to be the insulator 550, and the conductive film to be the conductor 560 are partly removed by CMP treatment or the like until the insulator 580 is exposed; thus, the transistor illustrated in FIG. 8 can be formed.

Note that the insulator 544 and the insulator 545 are not essential components. Design is appropriately set in consideration of required transistor characteristics.

Since the existing device can be used as the transistor illustrated in FIG. 8 and the conductor 542 is not provided, a cost reduction can be achieved.

Structure Example 2 of Transistor

Although FIG. 4 and FIG. 5 illustrate a structure example in which the conductor 560 that functions as a gate is formed in an opening of the insulator 580, the structure of the OS transistor is not limited to this. For example, a structure in which the insulator is provided above the conductor can be employed. A structure example of such a transistor is illustrated in FIG. 9 and FIG. 10.

Figure 9A:
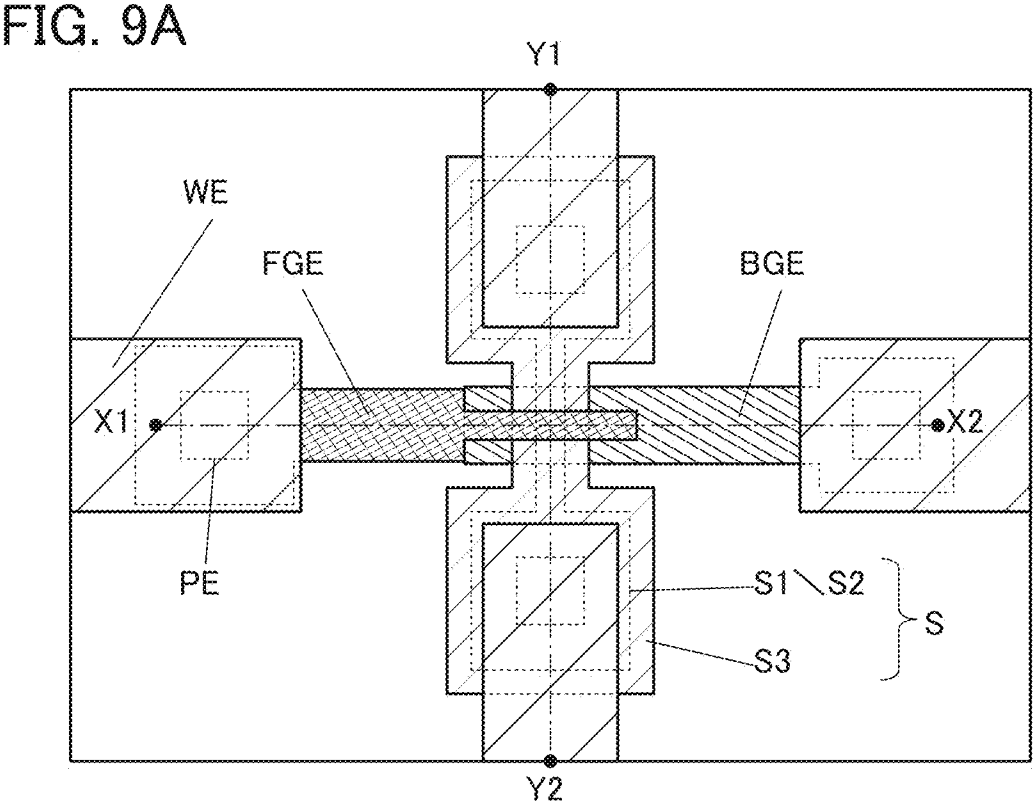
FIG. 9A is a top view illustrating a structure example of a transistor.
Figure 9B:
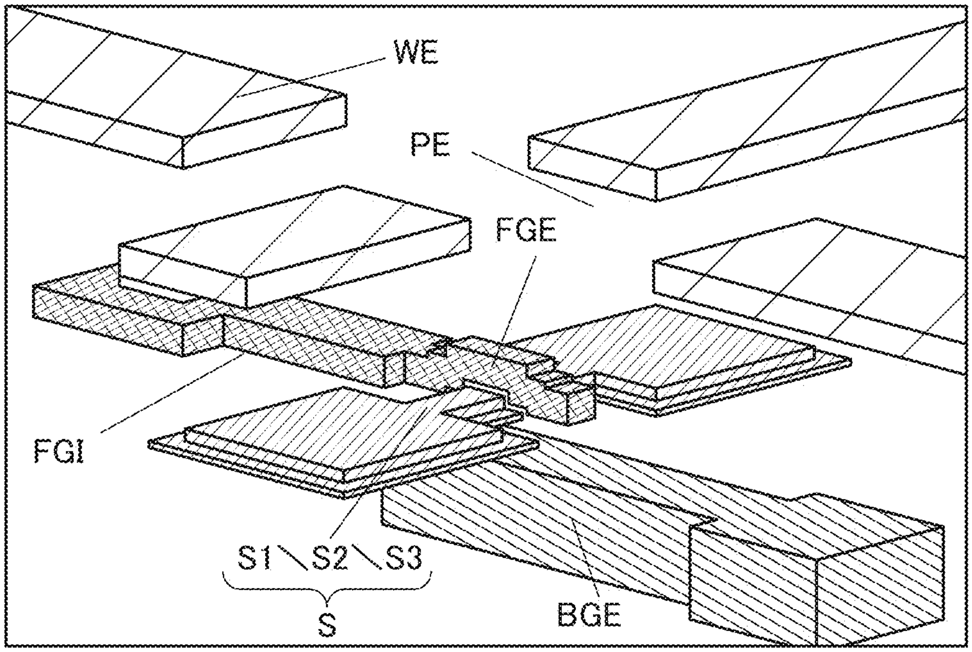
FIG. 9B is a perspective view illustrating the structure example of the transistor.
Figure 10A:
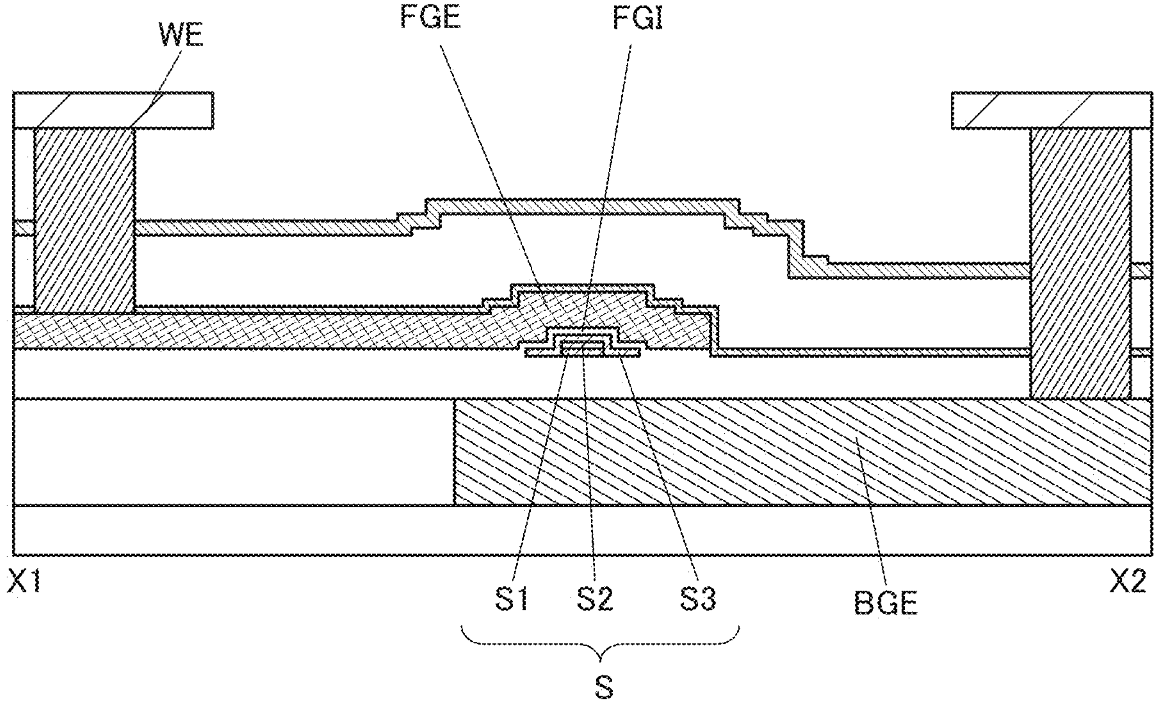
FIGS. 10A and 10B are cross-sectional views illustrating a structure example of a transistor.
Figure 10B:
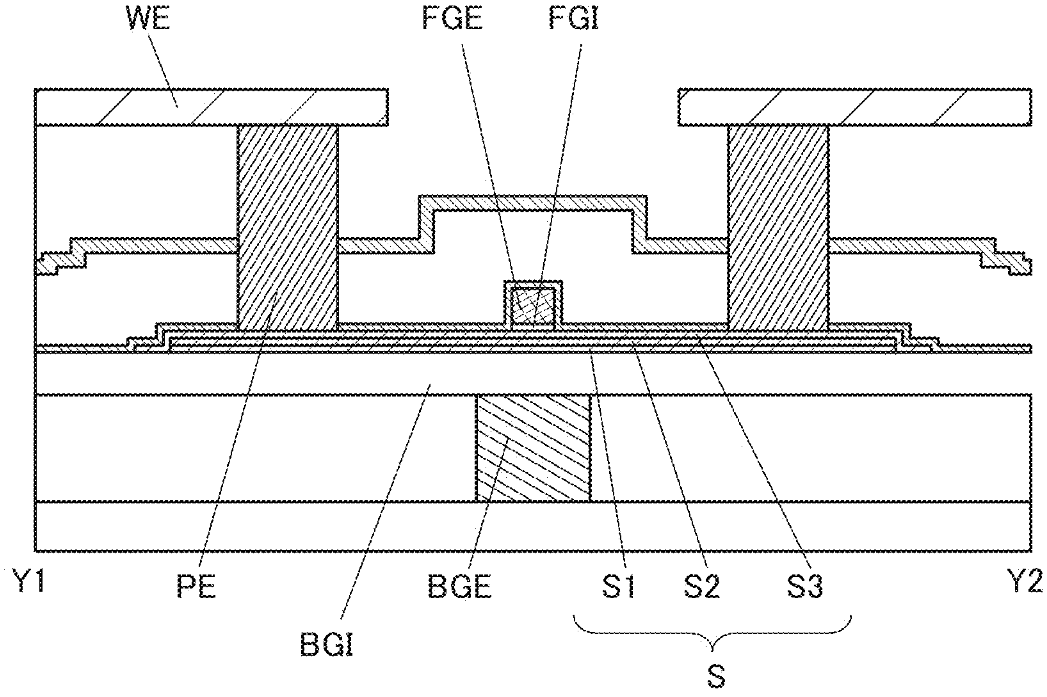

FIG. 9(A) is a top view of a transistor and FIG. 9(B) is a perspective view of the transistor. FIG. 10(A) is a cross-sectional view taken along X1-X2 in FIG. 9(A), and FIG. 10(B) is a cross-sectional view taken along Y1-Y2 in FIG. 9(A).

The transistor illustrated in FIG. 9 and FIG. 10 includes a conductor BGE having a function as a back gate, an insulator BGI having a function as a gate insulating film, an oxide semiconductor S, an insulator FGI having a function as a gate insulating film, a conductor FGE having a function as a front gate, and a conductor WE having a function as a wiring. A conductor PE has a function as a plug for connecting the conductor WE to the oxide S, the conductor BGE, or the conductor FGE. Note that an example in which the oxide semiconductor S includes three layers of oxides S1, S2, and S3 is shown here.

<Electrical Characteristics of Transistors>

Next, electrical characteristics of an OS transistor will be described below. A transistor including a first gate and a second gate is described below as an example. In the transistor including the first gate and the second gate, the threshold voltage can be controlled by applying different potentials to the first gate and the second gate. For example, by applying a negative potential to the second gate, the threshold voltage of the transistor can be higher than 0 V and the off-state current can be reduced. That is, when a negative potential is applied to the second gate electrode, a drain current when the potential applied to the first electrode is 0 V can be reduced.

When impurity such as hydrogen is added to an oxide semiconductor, the carrier density is increased in some cases. For example, hydrogen added to an oxide semiconductor reacts with oxygen bonded to a metal atom to be water, so that an oxygen vacancy is formed in some cases. Entry of hydrogen into the oxygen vacancy increases carrier density. Furthermore, in some cases, bonding of part of hydrogen to oxygen bonded to a metal atom causes generation of an electron serving as a carrier. That is, the oxide semiconductor to which an impurity such as hydrogen is added becomes n-type and has a reduced resistance.

Therefore, the resistance of the oxide semiconductor can be selectively reduced. That is, a region which has a low carrier density and functions as a semiconductor functioning as a channel formation region and a low-resistance region which has a high carrier density and functions as a source region or a drain region can be provided in the oxide semiconductor.

Here, evaluated is the influence of the structure of a low-resistance region and a high-resistance region provided in the oxide semiconductor on electrical characteristics of the transistor in the case where different potentials are applied to the first gate and the second gate.

[Structure of Transistor]

Figure 11A:
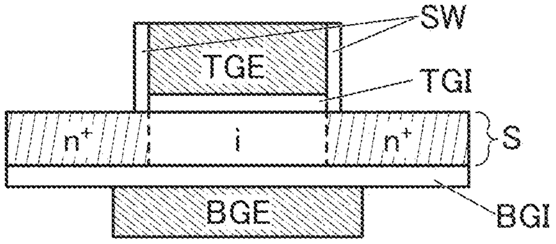
FIGS. 11A and 11C are cross-sectional views of transistors.
Figure 11B:
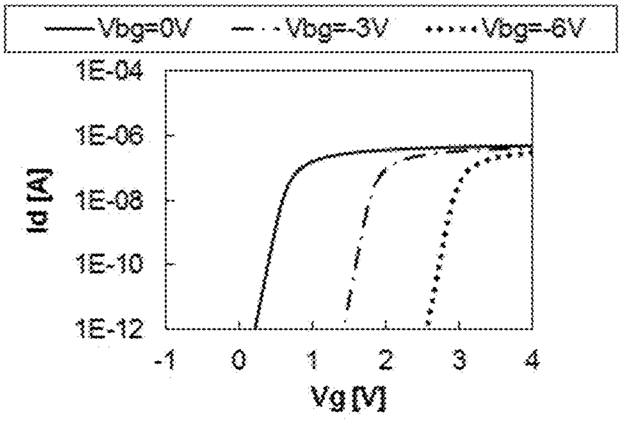
FIGS. 11B and 11D are electrical characteristics of the transistors.
Figure 11C:
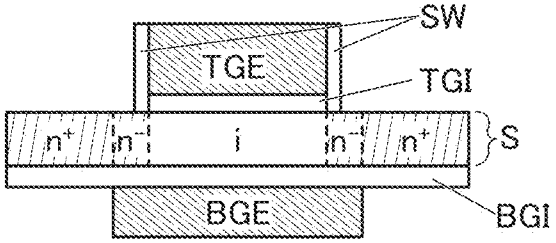

FIGS. 11(A) and 11(C) are each a cross-sectional view of a transistor used for the electrical characteristics evaluation. For clarity of the drawings, some components are not illustrated in FIGS. 11(A) and 11(C).

The transistor illustrated in FIGS. 11(A) and 11(C) includes a conductor TGE that functions as a first gate, an insulator TGI that functions as a first gate insulating film, an insulator SW that functions as a sidewall provided on a side surface of the first gate, an oxide semiconductor S, a conductor BGE that functions as a second gate, and an insulator BGI that functions as a second gate insulator. The insulator BGI has a three-layer structure formed of a first layer in contact with the conductor BGE, a second layer over the first layer, and a third layer over the second layer. Note that the third layer is in contact with the oxide semiconductor S.

Here, the oxide semiconductor S included in the transistor illustrated in FIG. 11(A) has an $n^+$ region and an i region overlapping with the conductor TGE. On the other hand, the oxide semiconductor S included in the transistor illustrated in FIG. 11(C) has the $n^+$ region, the i region overlapping with the conductor TGE, and an $n^-$ region between the $n^+$ region and the i region.

Note that the $n^+$ region functions as a source region or a drain region and has a high carrier density and reduced resistance. The i region functions as a channel formation region and is a high-resistance region whose carrier density is lower than the $n^+$ region. The $n^-$ region has a lower carrier density than the $n^+$ region and a higher carrier density than the i region.

Although not illustrated, the $n^+$ region of the oxide semiconductor S is in contact with an S/D electrode functioning as a source or a drain.

[Results of Electrical Characteristics Evaluation]

The Id-Vg characteristics of the transistor illustrated in FIG. 11(A) and the transistor illustrated in FIG. 11(C) are calculated to evaluate electrical characteristics of the transistors.

Here, as an index of the electrical characteristics of a transistor, the amount of change (hereinafter also referred to as ΔVsh) in the threshold voltage (hereinafter also referred to as Vsh) of the transistor is used. Note that in the Id-Vg characteristics, Vsh is defined as the value of Vg when $Id=1.0\times10^{-12}$ [A] is satisfied.

Note that the Id-Vg characteristics are characteristics of a change in a current between the source and the drain (hereinafter also referred to as a drain current (Id)) when a potential applied to the conductor TGE functioning as a first gate of the transistor (hereinafter also referred to as a gate potential (Vg)) is changed from a first value to a second value.

Here, evaluated are changes in a drain current (Id) when a potential between a source and a drain (hereinafter also referred to as a drain potential Vd) is set to +0.1 V and a potential between the source and the conductor TGE functioning as a first gate is changed from −1 V to +4 V.

A device simulator "Atlas" developed by Silvaco Inc. is used for the calculation. Table 1 lists parameters used for the calculation. Note that Eg represents an energy gap, Nc represents the effective density of states in the conduction band, and Nv represents the effective density of states in the valence band.

TABLE 1

| Software | | Atlas 2D produced by Silvaco Inc. | | |
|---|---|---|---|---|
| Structure | | Channel length (L) | 350 | nm |
| | | Channel width (W) | 350 | nm |
| BGE | | Work function | 5.0 | eV |
| | | Film thickness (wiring) | 20 | nm |
| | | Length in L direction | 510 | nm |
| BGI | Third layer | Relative permittivity | 4.1 | |
| | | Film thickness | 10 | nm |
| | Second layer | Relative permittivity | 16.4 | |
| | | Film thickness | 10 | nm |
| | First layer | Relative permittivity | 4.1 | |
| | | Film thickness | 10 | nm |
| OS | | Electron affinity | 4.5 | eV |
| | | Eg | 2.9 | eV |

TABLE 1-continued

| Software | Atlas 2D produced by Silvaco Inc. | | |
|---|---|---|---|
| | Relative permittivity | 15 | |
| | Electron mobility | 20 | $cm^2/Vs$ |
| | Hole mobility | 0.01 | $cm^2/Vs$ |
| | Nc | 5E+18 | $cm^{-3}$ |
| | Nv | 5E+18 | $cm^{-3}$ |
| | Film thickness | 15 | nm |
| $n^+$ region | Length in L direction | 655 or 700 | nm |
| | Carrier concentration | 5E+18 | $cm^{-3}$ |
| $n^-$ region | Length in L direction | 45 or 0 | nm |
| | Carrier concentration | 1E+17 | $cm^{-3}$ |
| TGI | Relative permittivity | 4.1 | |
| | Film thickness | 10 | nm |
| SW | Relative permittivity | 4.1 | |
| | Width | 15 | nm |
| TGE | Work function | 5.0 | eV |
| | Film thickness | 20 | nm |
| | Length in L direction | 350 | nm |
| S/D electrode | Work function | 4.5 | eV |

In the transistor illustrated in FIG. 11(A), one of the $n^+$ regions is set to 700 nm, and one of the $n^-$ regions is set to 0 nm. In the transistor illustrated in FIG. 11(C), one of the $n^+$ regions is set to 655 nm and one of the $n^-$ regions is set to 45 nm. Each of the transistor illustrated in FIG. 11(A) and the transistor illustrated in FIG. 11(C) has a structure in which the second gate is larger than the i region. Note that in this evaluation, a potential of the conductor BGE functioning as a second gate (hereinafter also referred to as a backgate potential (Vbg)) is set to 0.00 V, −3.00 V, or −6.00 V.

FIG. 11(B) shows the results of the Id-Vg characteristics obtained by the calculation of the transistor illustrated in FIG. 11(A). The amount of change in the threshold voltage (ΔVsh) of the transistor when the backgate potential is set to −3.00 V is +1.2 V as compared with that when the backgate potential is set to 0.00 V. The amount of change in the threshold voltage (ΔVsh) of the transistor when the backgate potential is set to −6.00 V is +2.3 V as compared with that when the backgate potential is set to 0.00 V. That is, the amount of change in the threshold voltage (ΔVsh) of the transistor when the backgate potential is set to −6.00 V is +1.1 V as compared with that when the backgate potential is set to −3.00 V. Therefore, even when the potential of the conductor BGE functioning as a second gate is made higher, the amount of change in the threshold voltage of the transistor is hardly changed. In addition, even when the backgate potential is increased, the rising characteristics are not changed.

Figure 11D:
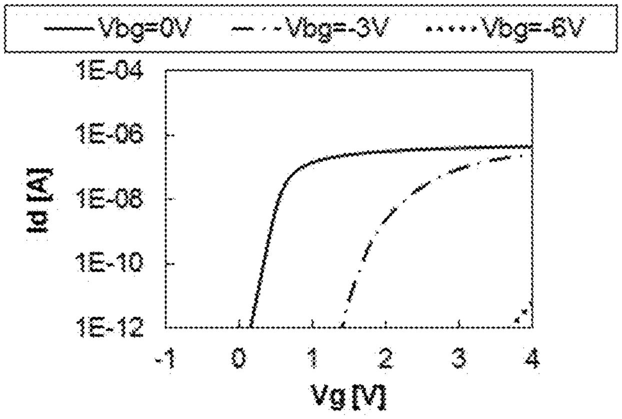

FIG. 11(D) shows the results of the Id-Vg characteristics obtained by the calculation of the transistor illustrated in FIG. 11(C). The amount of change in the threshold voltage (ΔVsh) of the transistor when the backgate potential is set to −3.00 V is +1.2 V as compared with that when the backgate potential is set to 0.00 V. The amount of change in the threshold voltage (ΔVsh) of the transistor when the backgate potential is set to −6.00 V is +3.5 V as compared with that when the backgate potential is set to 0.00 V. That is, the amount of change in the threshold voltage (ΔVsh) of the transistor when the backgate potential is set to −6.00 V is +2.3 V as compared with that when the backgate potential is set to −3.00 V. Therefore, the higher the potential of the conductor BGE functioning as a second gate is made, the larger the amount of change in the threshold voltage of the transistor becomes. As the backgate potential is increased, the rising characteristics become worse.

As described above, it is found that in the transistor illustrated in FIG. 11(C), the higher the potential of the conductor BGE functioning as a second gate is made, the larger the amount of change in the threshold voltage of the transistor becomes. In contrast, in the transistor illustrated in FIG. 11(A), the amount of change in the threshold voltage of the transistor is not changed even when the potential of the conductor BGE functioning as a second gate is increased.

Note that this embodiment can be implemented in combination with the other embodiments described in this specification as appropriate.

Embodiment 3

In this embodiment, the composition of a metal oxide that can be used in the OS transistor described in the above embodiment, will be described.

<Composition of Metal Oxide>

In this specification and the like, "CAAC (c-axis aligned crystal)" or "CAC (Cloud-Aligned Composite)" might be stated. Note that CAAC refers to an example of a crystal structure, and CAC refers to an example of a function or a material composition.

A CAC-OS or a CAC-metal oxide has a conducting function in a part of the material and has an insulating function in a part of the material, and has a function of a semiconductor as the whole material. Note that in the case where the CAC-OS or the CAC-metal oxide is used in a channel formation region of a transistor, the conducting function is a function of allowing electrons (or holes) serving as carriers to flow, and the insulating function is a function of not allowing electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC-metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

The CAC-OS or the CAC-metal oxide is formed of components having different bandgaps. For example, the CAC-OS or the CAC-metal oxide is formed of a component having a wide gap due to the insulating region and a component having a narrow gap due to the conductive region. When carriers flow in such a structure, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current drive capability in the on state of the transistor, that is, high on-state current and high field-effect mobility, can be obtained.

In other words, the CAC-OS or the CAC-metal oxide can also be called a matrix composite or a metal matrix composite.

<Structure of Metal Oxide>

An oxide semiconductor is classified into a single crystal oxide semiconductor and a non-single crystal oxide semiconductor. Examples of a non-single crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

Note that as a metal semiconductor used for a semiconductor of a transistor, a thin film having high crystallinity is preferably used. With the use of the thin film, the stability or the reliability of the transistor can be improved. Examples of the thin film include a thin film of a single-crystal oxide semiconductor and a thin film of a polycrystalline oxide semiconductor. However, to form the thin film of a single-crystal oxide semiconductor or the thin film of a polycrystalline oxide semiconductor over a substrate, a high-temperature process or a laser heating process is needed. Thus, the manufacturing cost is increased, and in addition, the throughput is decreased.

Non-Patent Document 2 and Non-Patent Document 3 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 4). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 5 and Non-Patent Document 6 have shown a change in average crystal size due to electron beam irradiation to thin films of the above CAAC-IGZO, the above nc-IGZO, and IGZO having low crystallinity. In the thin film of IGZO having low crystallinity, crystalline IGZO with a crystal size of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

The CAAC-OS has c-axis alignment, a plurality of nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the plurality of nanocrystals are connected.

The nanocrystal is basically a hexagon but is not always a regular hexagon and is a non-regular hexagon in some cases. Furthermore, a pentagonal lattice arrangement, a heptagonal lattice arrangement, and the like are included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of a lattice arrangement. This is probably because the CAAC-OS can tolerate distortion owing to a low density of oxygen atom arrangement in an a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. Furthermore, when indium of the In layer is replaced by the element M, the layer can also be referred to as an (In, M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

The nc-OS has a periodic atomic arrangement in a microscopic region (for example, a region with a size greater than or equal to 1 nm and less than or equal to 10 nm, in particular, a region with a size greater than or equal to 1 nm and less than or equal to 3 nm). In addition, no regularity of crystal orientation is observed between different nanocrystals in the nc-OS. Thus, the orientation is not observed in the whole film. Accordingly, in some cases, the nc-OS cannot be distinguished from an a-like OS or an amorphous oxide semiconductor depending on an analysis method.

The a-like OS is an oxide semiconductor that has a structure between those of the nc-OS and the amorphous oxide semiconductor. The a-like OS has a void or a low-density region. That is, the a-like OS has low crystallinity as compared with the nc-OS and the CAAC-OS.

An oxide semiconductor has various structures with different properties. Two or more kinds among the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

Note that when the above oxide semiconductor is used for a transistor, a transistor with high field-effect mobility can be achieved. In addition, a transistor with high reliability can be achieved.

Non-Patent Document 7 shows that the transistor using an oxide semiconductor has an extremely low leakage current in an off state; specifically, the off-state current per micrometer in the channel width of the transistor is of the order of yA/μm ($10^{-24}$ A/μm). For example, a low-power-consumption CPU utilizing a characteristic of low leakage current of the transistor using an oxide semiconductor is disclosed (see Non-Patent Document 8).

Furthermore, application of a transistor using an oxide semiconductor to a display device that utilizes the characteristic of a low leakage current of the transistor has been reported (see Non-Patent Document 9). In the display device, a displayed image is changed several tens of times per second. The number of times an image is changed per second is referred to as a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

An oxide semiconductor with a low carrier density is preferably used for a transistor. In the case where the carrier density of an oxide semiconductor film is lowered, the impurity concentration in the oxide semiconductor film is lowered to lower the density of defect states. In this specification and the like, a state with a low impurity concentration and a low density of defect states is referred to as a highly purified intrinsic or substantially highly purified intrinsic state. For example, the carrier density of the oxide semiconductor is lower than $8\times10^{11}/cm^3$, preferably lower than $1\times10^{11}/cm^3$, more preferably lower than $1\times10^{10}/cm^3$, and greater than or equal to $1\times10^{-9}/cm^3$.

In addition, a highly purified intrinsic or substantially highly purified intrinsic oxide semiconductor film has a low density of defect states and accordingly has a low density of trap states in some cases.

Furthermore, charges trapped by the trap states in the oxide semiconductor take a long time to disappear and may behave like fixed charges. Thus, a transistor whose channel region is formed in an oxide semiconductor with a high density of trap states has unstable electrical characteristics in some cases.

Thus, in order to stabilize electrical characteristics of the transistor, reducing the impurity concentration in the oxide semiconductor is effective. Furthermore, in order to reduce the impurity concentration in the oxide semiconductor, it is preferred that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of the Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2\times10^{18}$ atoms/$cm^3$, preferably lower than or equal to $2\times10^{17}$ atoms/$cm^3$.

Furthermore, when the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferred to reduce the concentration of an alkali metal or an alkaline earth metal in the oxide semiconductor. Specifically, the concentration of an alkali metal or an alkaline earth metal in the oxide semiconductor obtained by SIMS is set lower than or equal to $1\times10^{18}$ atoms/$cm^3$, preferably lower than or equal to $2\times10^{16}$ atoms/$cm^3$.

Furthermore, when containing nitrogen, the oxide semiconductor easily becomes n-type by generation of electrons serving as carriers and an increase of carrier density. As a result, a transistor using an oxide semiconductor containing nitrogen as a semiconductor is likely to have normally-on characteristics. For this reason, nitrogen in the oxide semiconductor is preferably reduced as much as possible; the nitrogen concentration in the oxide semiconductor obtained by SIMS is set, for example, lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, and still more preferably lower than or equal to $5\times10^{17}$ atoms/$cm^3$.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1\times10^{20}$ atoms/$cm^3$, preferably lower than $1\times10^{19}$ atoms/$cm^3$, more preferably lower than $5\times10^{18}$ atoms/$cm^3$, and still more preferably lower than $1\times10^{18}$ atoms/$cm^3$.

When an oxide semiconductor with sufficiently reduced impurities is used for a channel formation region of a transistor, stable electrical characteristics can be given.

The discovery of the CAAC structure and the nc structure has contributed to an improvement in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the characteristics of a low leakage current of the transistor have been studied.

Note that this embodiment can be implemented in combination with the other embodiments described in this specification as appropriate.

Embodiment 4

In this embodiment, examples of electronic devices each including the imaging device 10 described in the above embodiment will be described.

Figure 12A:
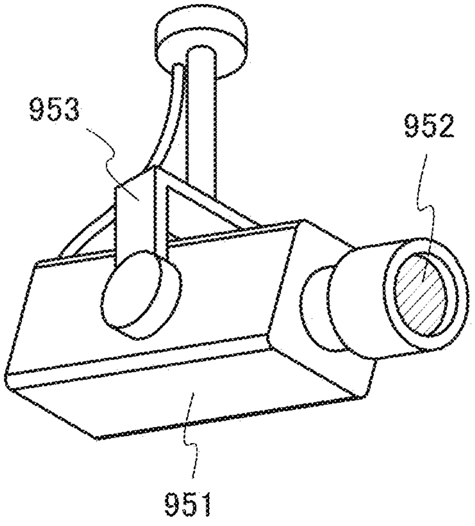
FIGS. 12A-12D are views illustrating structure examples of electronic devices.

FIG. 12(A) illustrates a surveillance camera which includes a housing 951, a lens 952, a support portion 953, and the like. The surveillance camera can include the imaging device of one embodiment of the present invention as a component for obtaining an image. Thus, the surveillance camera can be reduced in size and weight. Furthermore, a highly reliable surveillance camera can be provided even in a high temperature environment. Note that a surveillance camera is a name in common use and the name does not limit the use thereof. A device that has a function as a surveillance camera is also referred to as a camera or a video camera, for example.

Figure 12B:
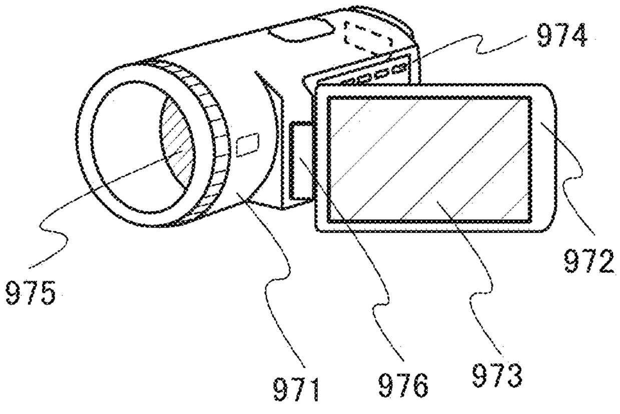

FIG. 12(B) illustrates a video camera which includes a first housing 971, a second housing 972, a display portion 973, operation buttons 974, a lens 975, a connection portion 976, and the like. The operation button 974 and the lens 975 are provided on the first housing 971, and the display portion 973 is provided on the second housing 972. The video camera can include the imaging device of one embodiment of the present invention as a component for obtaining an image. Thus, the video camera can be reduced in size and weight. Furthermore, a video camera capable of performing imaging for a long time with low power consumption can be provided. A video camera capable of high-speed imaging can be provided.

Figure 12C:
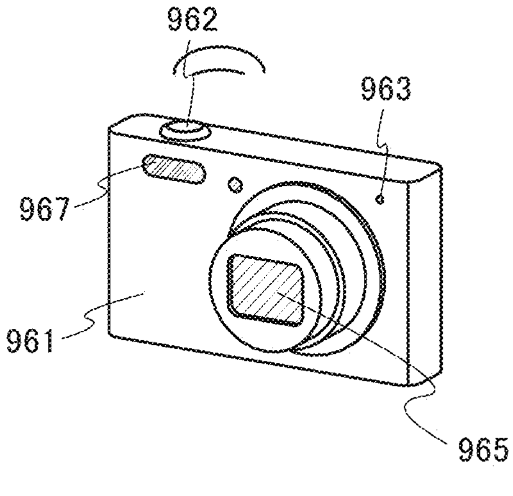

FIG. 12(C) illustrates a digital camera which includes a housing 961, a shutter button 962, a microphone 963, a light-emitting portion 967, a lens 965, and the like. The digital camera can include the imaging device of one embodiment of the present invention as a component for obtaining an image. Thus, the digital camera can be reduced in size and weight. Furthermore, a digital camera capable of high-speed imaging can be provided.

Figure 12D:
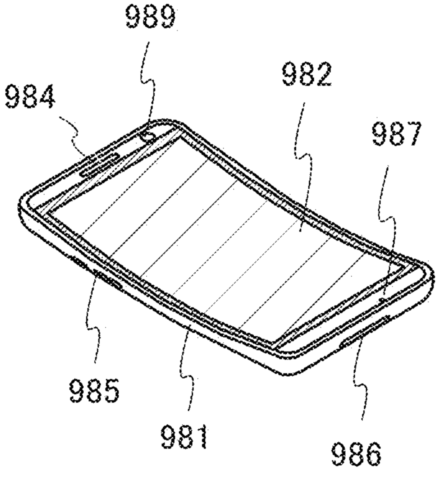

FIG. 12(D) illustrates a mobile phone (smartphone) which includes a display portion 982, a microphone 987, a speaker 984, a camera 989, an input/output terminal 986, an operation button 985, and the like in a housing 981. A touch panel function of the display portion 982 enables input and output of information. The mobile phone can include the imaging device of one embodiment of the present invention as a component for obtaining an image. Thus, the mobile phone can be reduced in size and weight. Furthermore, a mobile phone capable of high-speed imaging can be provided. A mobile phone in which power consumption of an imaging operation is reduced can be provided.

Figure 13:
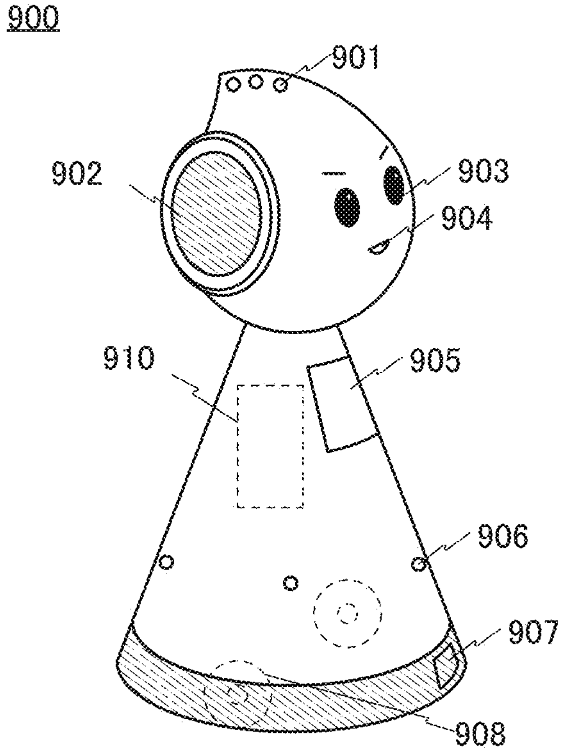
FIG. 13 is a view illustrating a structure example of an electronic device.

A robot 900 illustrated in FIG. 13 includes an arithmetic device 910, an illuminance sensor 901, a microphone 902, an upper camera 903, a speaker 904, a display 905, a lower camera 906, an obstacle sensor 907, and a moving mechanism 908. The upper camera 903 and the lower camera 906 each have a function of taking an image of the surroundings of the robot 900. The obstacle sensor 907 can detect, with the use of the moving mechanism 908, the presence of an obstacle in the direction where the robot 900 advances. The robot 900 can move safely by recognizing the surroundings with the upper camera 903, the lower camera 906, and the obstacle sensor 907.

In the robot 900, the upper camera 903 and the lower camera 906 can each include the imaging device of one embodiment of the present invention as a component for obtaining an image. Thus, the robot can be reduced in size and weight. Furthermore, a highly reliable robot capable of transferring safely even in a high temperature environment can be provided.

Note that the electronic devices, the functions of the electronic devices, its effects, and the like described in this embodiment can be combined as appropriate with the description of another electronic device. This embodiment can be implemented in combination with the other embodiments described in this specification as appropriate.

Example

In this example, a DRAM (DOSRAM) in which a transistor using an oxide semiconductor is used for a memory cell was fabricated, and it was confirmed that the fabricated DOSRAM can retain the stored content for 100000 seconds. Furthermore, it was estimated that a reduction in refresh rate can achieve a 50% reduction in power consumption at maximum as compared with a conventional DRAM.

Table 2 shows the specifications of the fabricated DOSRAM. In the DOSRAM, a 60-nm OSFET process is used for the memory cell and an oxide semiconductor transistor is used. For a driver circuit that has a function of selecting a memory cell, writing data to a memory cell, reading out data stored in a memory cell, or the like, a 65-nm CMOS process is employed and a Si transistor is used.

TABLE 2

| Technology | CMOS 65 nm<br>OSFET 60 nm |
|---|---|
| Supply Voltage | VDD: 1.2 V/VPP: 3.3 V |
| Cell element | 1Tr1C |
| Cs value | 3.5 fF |
| Density | 64 kbit |
| Cycle time | 10 ns |
| Retention time | 100,000 sec. |
| I/O width | ×32 |

Figure 14A:
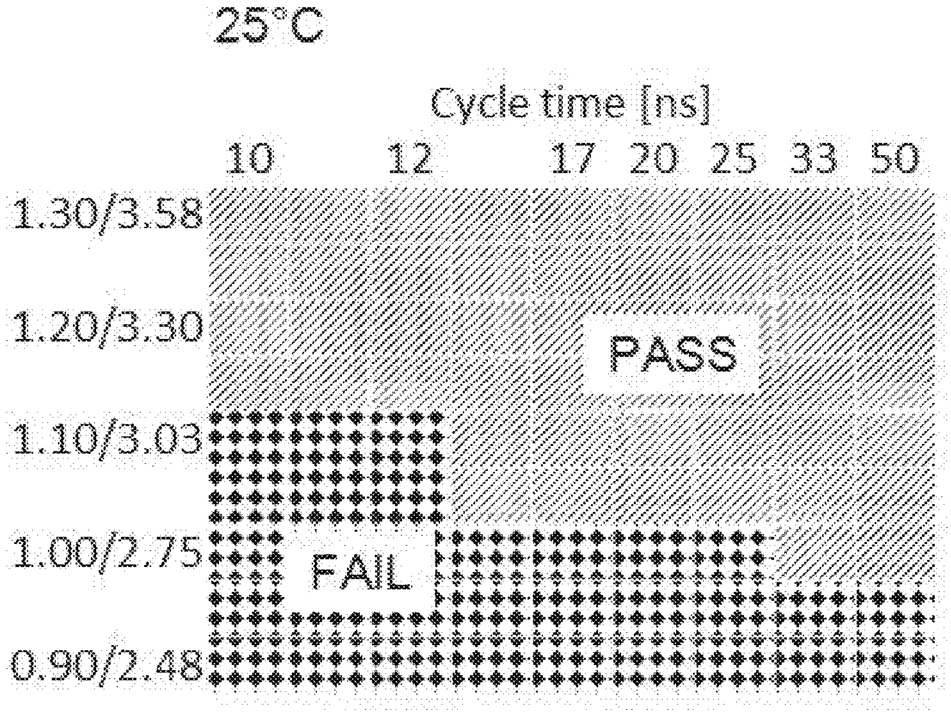
FIGS. 14A and 14B are graphs showing Shmoo plots.
Figure 14B:
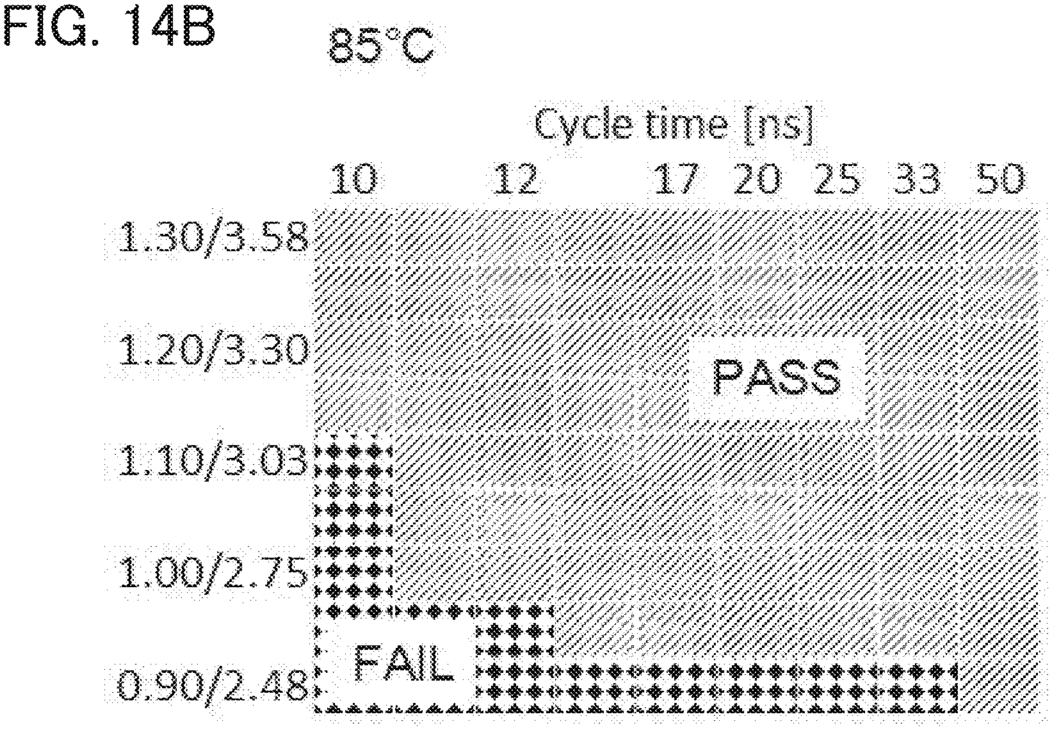

FIG. 14(A) shows a Shmoo plot at 25° C. and FIG. 14(B) shows a Shmoo plot at 85° C. It is found that operation with a cycle time of 10 ns can be performed under conditions that the supply voltage is 1.2 V and the temperature range is from 25° C. to 85° C. This satisfies the specifications of the conventional DRAM; accordingly, the fabricated DRAM can probably maintain compatibility with the conventional DRAM.

Figure 15:
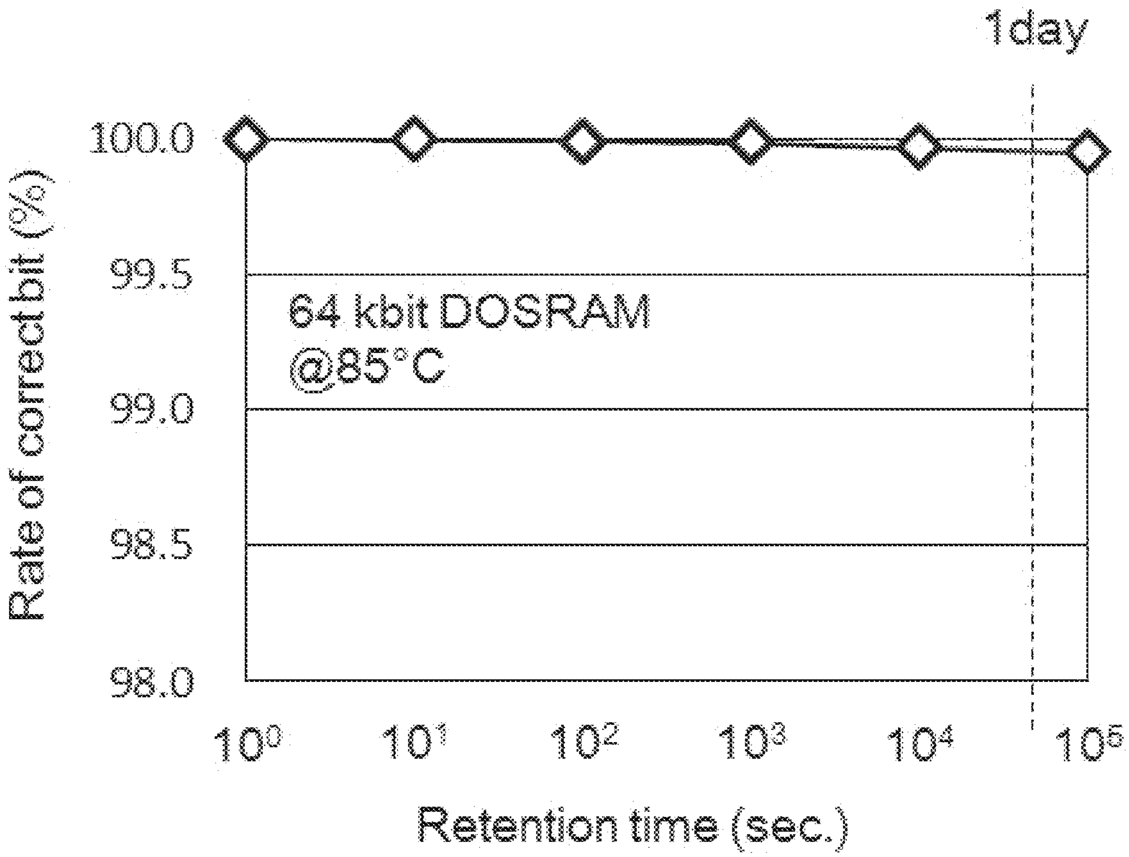
FIG. 15 is a graph showing memory retention characteristics.

FIG. 15 shows memory retention characteristics (Retention characteristics) at 85° C. Favorable data retention characteristics with a rate of correct bit of 99.97% are shown after 105 seconds.

Figure 16A:
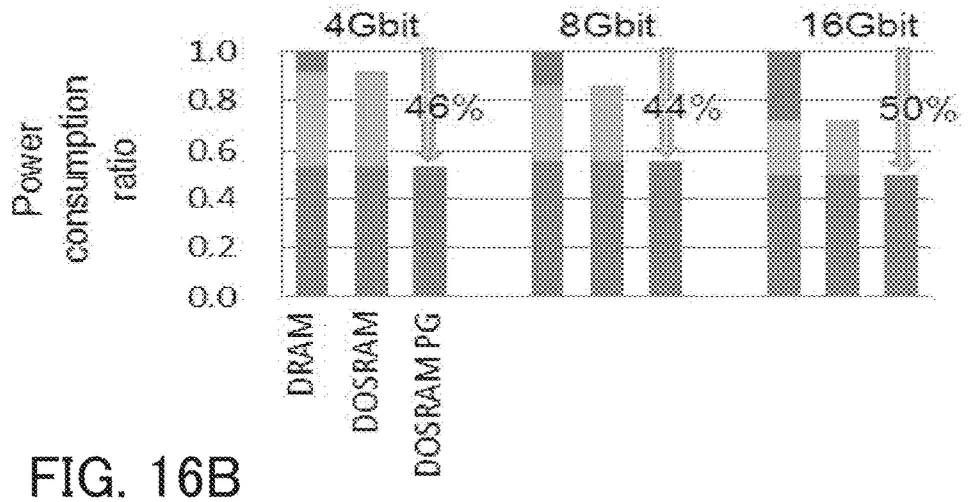
FIGS. 16A-16C are graphs showing estimated power consumption.
Figure 16B:
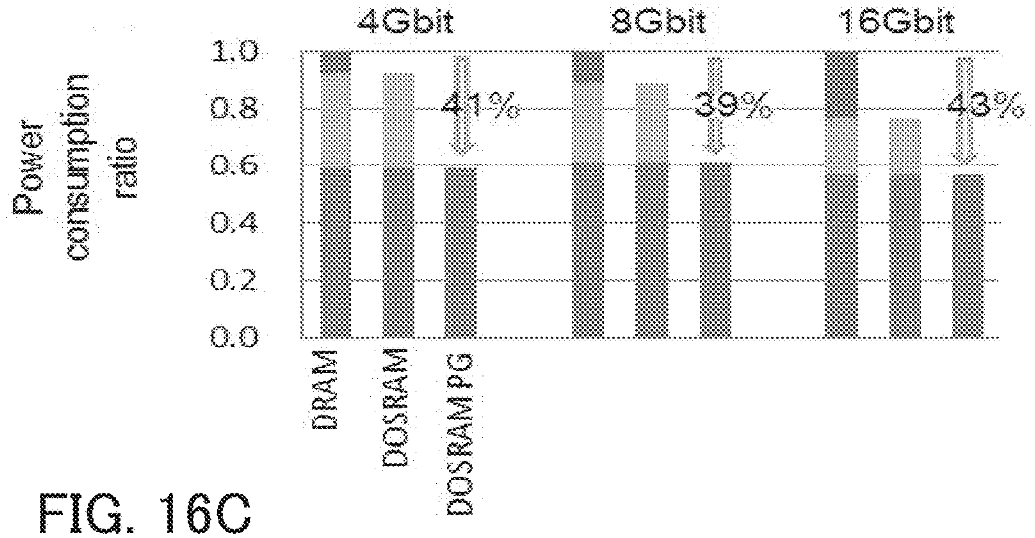
Figure 16C:
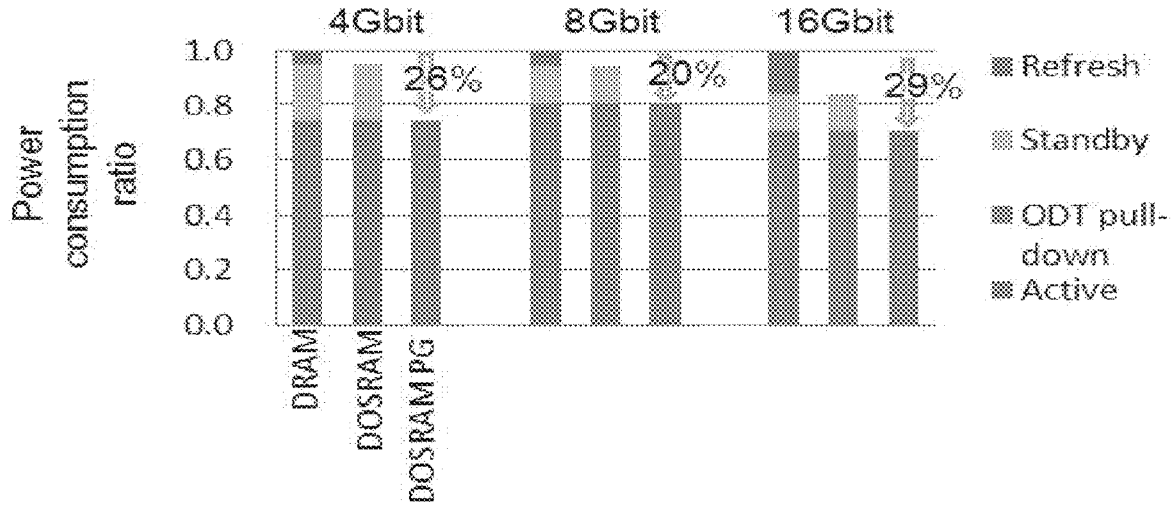

FIG. 16 shows the estimation results of the power consumption (Power Consumption Ratio) in the case where power gating is performed in a DRAM, a DOSRAM, and a DOSRAM. In FIG. 16, it is assumed that the oxide semiconductor transistor can be miniaturized and the same cell size and memory capacitance as a DRAM can be achieved. FIG. 16(A) shows an I/O number of ×4 and memory capacity of 4 Gbit, FIG. 16(B) shows an I/O number of ×8 and memory capacity of 8 Gbit, and FIG. 16(C) shows an I/O number of ×16 and memory capacitance of 16 Gbit.

Since refresh operation is unnecessary for a DOSRAM, power needed for the refresh operation can be saved. Furthermore, power gating can reduce standby power. The proportion of the power required for the refresh operation increases as the memory density is higher and the I/O number is smaller. As a result, it was estimated that the total power can be reduced by 50% at maximum (see FIG. 16(A)). Note that for the calculation, "Micron DDR4 SDRAM System-Power Calculator" produced by Micron Technology, Inc. was used.

REFERENCE NUMERALS a1: node, a2: node, a3: node, a4: node, N1: node, S: oxide, S1: oxide, SUB1: semiconductor substrate, SUB2: semiconductor substrate, 10: imaging device, 15: imaging device, 20: light, 100: layer, 110: signal processing circuit, 111: control circuit, 112: control circuit, 113: image processing circuit, 114: input/output circuit, 115: bus line, 116: power supply circuit, 200: layer, 200*a*: layer, 201: conductor, 210: memory device, 211: cell array, 212: memory cell, 213: transistor, 214: capacitor, 215: transistor, 221: driver circuit, 222: driver circuit, 300: layer, 301: conductor, 310: image sensor, 311: pixel array, 312: pixel, 313: photoelectric conversion element, 314: transistor, 315: transistor, 316: transistor, 317: transistor, 318: capacitor, 321: driver circuit, 322: driver circuit, 331: node, 332: wiring, 333: wiring, 334: wiring, 400: transistor, 400*a*: transistor, 400*b*: transistor, 411: semiconductor substrate, 413: semiconductor region, 414*a*: low-resistance region, 414*b*: low-resistance region, 415: insulator, 416: conductor, 417: semiconductor region, 418*a*: low-resistance region, 418*b*: low-resistance region, 420: insulator, 422: insulator, 424: insulator, 426: insulator, 428: conductor, 430: conductor, 450: insulator, 452: insulator, 454: insulator, 456: conductor, 460: insulator, 462: insulator, 464: insulator, 466: conductor, 500: transistor, 500A: transistor, 503: conductor, 503*a*: conductor, 503*b*: conductor, 510: insulator, 512: insulator, 514: insulator, 516: insulator, 518: conductor, 520: insulator, 522: insulator, 524: insulator, 530: oxide, 530*a*: oxide, 530*b*: oxide, 530*c*: oxide, 540*a*: conductor, 540*b*: conductor, 542: conductor, 542*a*: conductor, 542*b*: conductor, 543: region, 543*a*: region, 543*b*: region, 544: insulator, 545: insulator, 546: conductor, 548: conductor, 550: insulator, 560: conductor, 560*a*: conductor, 560*b*: conductor, 574: insulator, 580: insulator, 581: insulator, 582: insulator, 586: insulator, 600: capacitor, 610: conductor, 612: conductor, 620: conductor, 630: insulator, 646: conductor, 648: conductor, 650: insulator, 660: conductor, 700*a*: transistor, 700*c*: photodiode, 711: semiconductor substrate, 713: semiconductor region, 714*a*: low-resistance region, 714*b*: low-resistance region, 715: insulator, 716: conductor, 718: p-type semiconductor region, 720: insulator, 722: insulator, 724: insulator, 726: insulator, 728: conductor, 730: conductor, 750: insulator, 752: insulator, 754: insulator, 756: conductor, 760: insulator, 762: insulator, 764: insulator, 766: conductor, 770: conductor, 900: robot, 901: illuminance sensor, 902: microphone, 903: upper camera, 904: speaker, 905: display, 906: lower camera, 907: obstacle sensor, 908: moving mechanism, 910: arithmetic device, 951: housing, 952: lens, 953: support portion, 961: housing, 962: shutter button, 963: microphone, 965: lens, 967: light-emitting portion, 971: housing, 972: housing, 973: display portion, 974: button, 975: lens, 976: connection portion, 981: housing, 982: display portion, 984: speaker, 985: button, 986: input/output terminal, 987: microphone, 989: camera.

The invention claimed is:

1. An imaging device comprising:

a first layer, a second layer over the first layer, a third layer over the second layer, and a fourth layer over the third layer, wherein the first layer has a signal processing circuit, wherein the second layer has a first memory device, wherein the third layer has a second memory device, wherein the fourth layer has an image sensor, wherein the signal processing circuit has a first transistor on a first semiconductor substrate, wherein the first memory device has a second transistor including a metal oxide in a channel formation region, wherein the second memory device has a third transistor including a metal oxide in a channel formation region, wherein the image sensor has a fourth transistor on a second semiconductor substrate, wherein the first to third transistors are arranged in a stack on a first surface side of the first semiconductor substrate, wherein the fourth transistor is arranged on a first surface side of the second semiconductor substrate, and wherein the first semiconductor substrate and the second semiconductor substrate are bonded together so that the first surface side of the first semiconductor substrate and the first surface side of the second semiconductor substrate face each other.

* * * * *